US009825132B2

(12) United States Patent
Sedighi et al.

(10) Patent No.: US 9,825,132 B2
(45) Date of Patent: Nov. 21, 2017

(54) SYSTEMS AND METHODS FOR FILTERING AND COMPUTATION USING TUNNELING TRANSISTORS

(71) Applicant: University of Notre Dame du Lac, Notre Dame, IN (US)

(72) Inventors: Behnam Sedighi, San Diego, CA (US); Xiaobo Sharon Hu, Granger, IN (US); Michael Niemier, Granger, IN (US); Joseph Nahas, Notre Dame, IN (US)

(73) Assignee: University of Notre Dame du Lac, South Bend, IN (US)

( * ) Notice: Subject to any disclaimer, the term of this patent is extended or adjusted under 35 U.S.C. 154(b) by 0 days.

(21) Appl. No.: 14/881,759

(22) Filed: Oct. 13, 2015

(65) Prior Publication Data

US 2017/0103979 A1   Apr. 13, 2017

(51) Int. Cl.
| | |
|---|---|
| *H01L 29/08* | (2006.01) |
| *H01L 29/786* | (2006.01) |
| *H03K 19/185* | (2006.01) |
| *H03K 19/094* | (2006.01) |
| *H01L 29/16* | (2006.01) |
| *H01L 29/739* | (2006.01) |
| *H01L 29/66* | (2006.01) |

(52) U.S. Cl.
CPC ...... *H01L 29/0895* (2013.01); *H01L 29/1606* (2013.01); *H01L 29/7391* (2013.01); *H01L 29/78648* (2013.01); *H03K 19/094* (2013.01); *H03K 19/185* (2013.01); *H01L 29/66977* (2013.01)

(58) Field of Classification Search
CPC   H01L 29/0895; H03K 19/094; H03K 19/185; H03K 19/19
See application file for complete search history.

(56) References Cited

U.S. PATENT DOCUMENTS

| | | | | | |
|---|---|---|---|---|---|
| 4,956,564 | A | * | 9/1990 | Holler | G06N 3/063 326/36 |
| 5,155,377 | A | * | 10/1992 | Castro | G06N 3/0635 327/427 |
| 5,247,206 | A | * | 9/1993 | Castro | G06N 3/063 706/33 |
| 5,303,329 | A | * | 4/1994 | Mead | G06N 3/0635 326/36 |
| 5,329,610 | A | * | 7/1994 | Castro | G06N 3/0635 706/18 |

(Continued)

Primary Examiner — Thomas J Hiltunen
(74) Attorney, Agent, or Firm — Greenberg Traurig, LLP

(57) ABSTRACT

An electrical circuit is disclosed that comprises plurality of tunneling field-effect transistors (TFETs) arranged in a diffusion network matrix having a plurality of nodes wherein, for each of the TFETs that is not on an end of the matrix, a drain of the TFET is electrically coupled with the source of at least one of the other TFETs at a node of the matrix and a source of the TFET is electrically coupled with the drain of at least one of the other TFETs at another node of the matrix. The electrical circuit further comprises a plurality of capacitors, wherein a respective one of the plurality of capacitors is electrically coupled with each node that includes the source of at least one TFET and the drain of at least one TFET. The TFETs may be symmetrical graphene-insulator-graphene field-effect transistors (SymFETs), for example.

20 Claims, 12 Drawing Sheets

(56) References Cited

U.S. PATENT DOCUMENTS

| | | | | |
|---|---|---|---|---|
| 5,521,857 A * | 5/1996 | Ni | ................... | G06G 7/1907 |
| | | | | 708/813 |
| 7,180,135 B1 * | 2/2007 | Ioannou | ............ | H01L 29/78648 |
| | | | | 257/347 |
| 9,040,957 B2 * | 5/2015 | Lee | ................... | H01L 29/78 |
| | | | | 257/27 |
| 9,197,215 B1 * | 11/2015 | Balandin | ................... | H03K 5/19 |
| 9,362,919 B1 * | 6/2016 | Sedighi | ................ | H03K 19/195 |
| 9,412,439 B1 * | 8/2016 | Fan | ................... | G11C 11/412 |
| 2015/0221499 A1 * | 8/2015 | Park | ................... | H01L 29/1606 |
| | | | | 257/29 |
| 2015/0333534 A1 * | 11/2015 | Liu | ................... | H01L 29/7391 |
| | | | | 307/104 |

\* cited by examiner

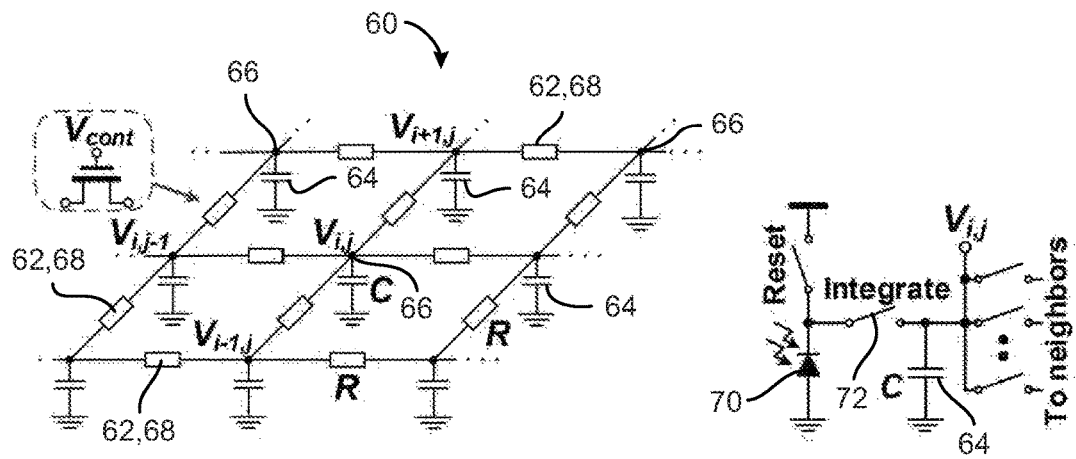
FIG. 3A
FIG. 3B
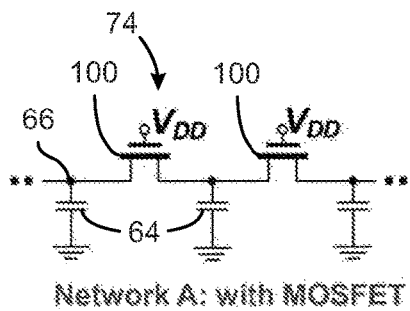
FIG. 4A
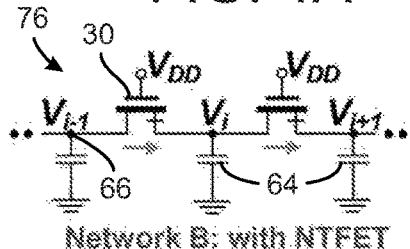
FIG. 4B
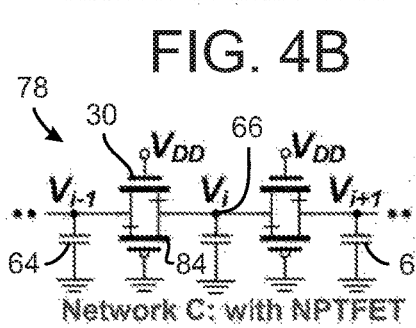
FIG. 4C
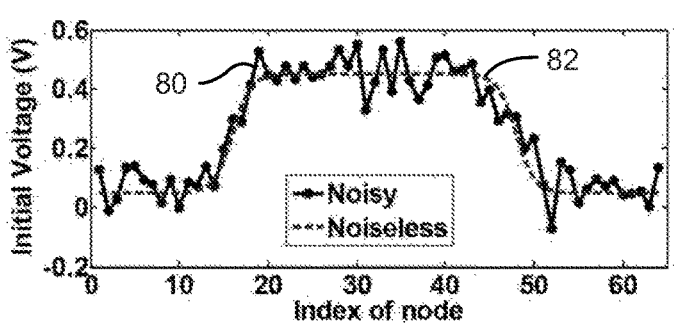
FIG. 4D
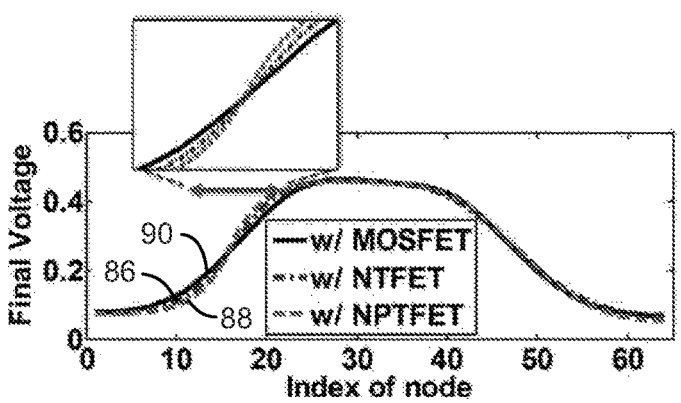
FIG. 4E

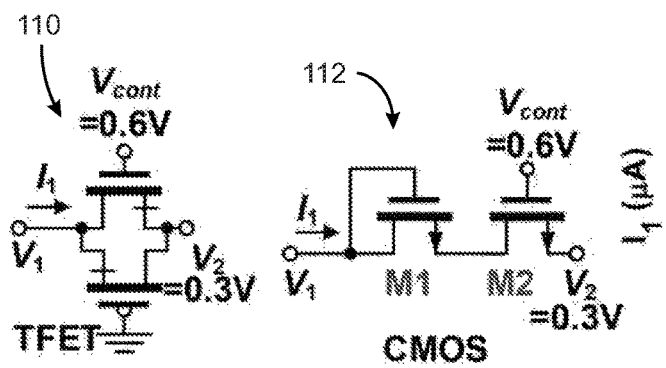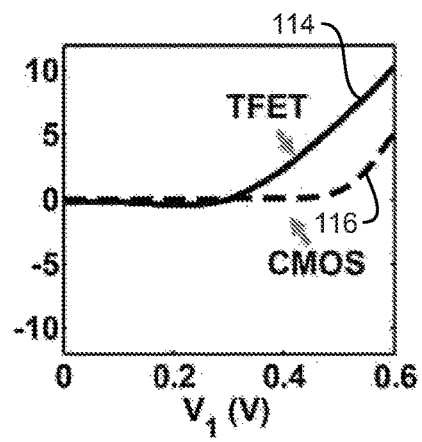
FIG. 7A
FIG. 7B
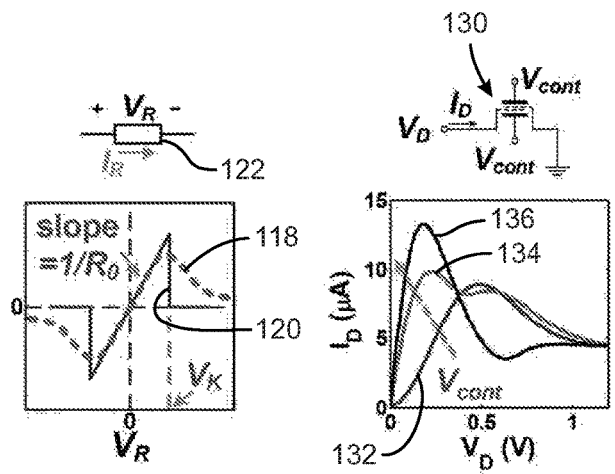
FIG. 8A
FIG. 8B
FIG. 8C

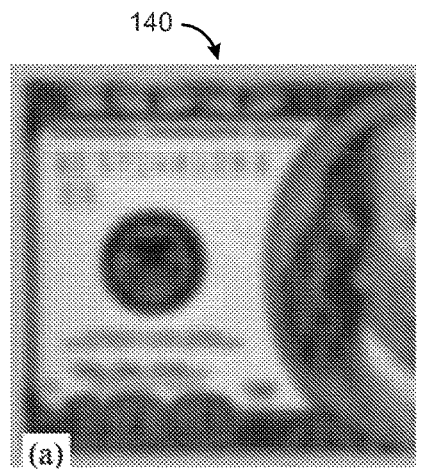
FIG. 9A    FIG. 9B
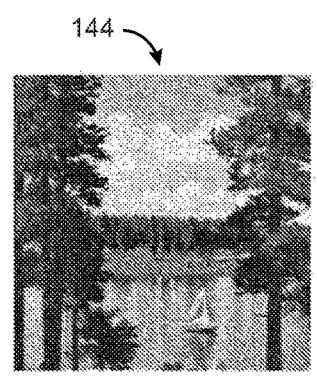
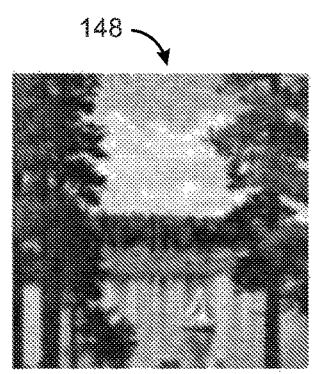
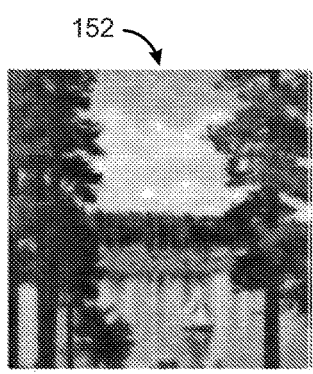
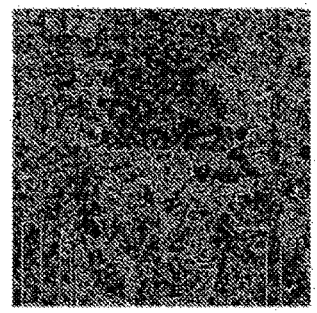
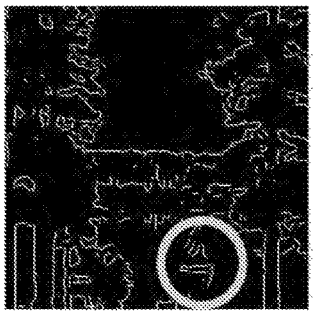
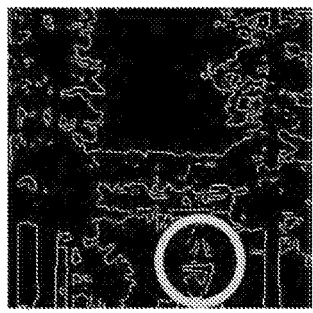
FIG. 10A    FIG. 10B    FIG. 10C $I_0 = 0.1$ nA/nm² $I_1 = 1.1$ nA/nm²
$V_0 = 0.47$ V  $V_1 = 0.23$ V
$k_0 = 0.61$ (a)

(b)

SYSTEMS AND METHODS FOR FILTERING AND COMPUTATION USING TUNNELING TRANSISTORS

FIELD OF THE DISCLOSURE

This disclosure is generally directed to analog circuits employing tunneling transistors, including analog filtering and arithmetic computation using tunneling transistors.

BACKGROUND OF RELATED ART

In the quest for future post-CMOS devices, many transistors have been proposed in the past decade. For example, tunnel field-effect transistors ("TFETs"), such as symmetric graphene-insulator-graphene TFETs (known as SymFETs), have some characteristics similar to those of MOSFETs and some that are different from MOSFETs. Accordingly, the inventors of this disclosure have appreciated that the particular characteristics of TFETs enable TFETs to be implemented in particular circuits to offer advantages over CMOS-based circuits.

BRIEF DESCRIPTION OF THE DRAWINGS

FIG. 3(a) is a diagrammatic schematic view of an example diffusion network circuit.

FIG. 3(b) is a schematic view of an example integrating circuit.

FIGS. 4(a), 4(b), and 4(c) are schematic views of example one-dimensional diffusion networks based on metal-oxide-semiconductor field-effect transistors (MOSFETs), n-type TFETs (NTFETs), and anti-parallel n-type and p-type TFETs (NPTFETs), respectively.

FIG. 4(d) is a plot illustrating an example input set that may be used in the diffusion networks of FIGS. 4(a)-(c).

FIG. 4(e) is a plot illustrating example output voltages from the diffusion networks of FIGS. 4(a)-(c) based on the example inputs of FIG. 4(d).

FIG. 7(a) illustrates schematic views of an example TFET-based and complementary metal-oxide-semiconductor (CMOS)-based directional resistors.

FIG. 7(b) is a plot illustrating respective I-V characteristics of the directional resistors of FIG. 7(a).

FIG. 8(a) is a plot illustrating an ideal nonlinear resistance and the resistance of a resistive fuse.

FIG. 8(b) is a plot illustrating the resistance of an example symmetrical graphene-insulator-graphene FET (SymFET) at various gate voltages.

FIG. 8(c) is a plot illustrating the I-V characteristic of an example SymFET for a range of source and drain voltages.

FIGS. 9(a) and 9(b) are the image of FIG. 6(a) after smoothing through an example isotropic diffusion network and an example SymFET-based anisotropic diffusion network, respectively.

FIGS. 10(a)-10(c) each illustrates an image and a Sobel edge detection of the image, with FIG. 10(a) illustrating the original image, FIG. 10(b) illustrating the image after smoothing with an example isotropic diffusion network, and FIG. 10(c) illustrating the image after smoothing with an example SymFET-based anisotropic diffusion network.

DETAILED DESCRIPTION

Figure 1:
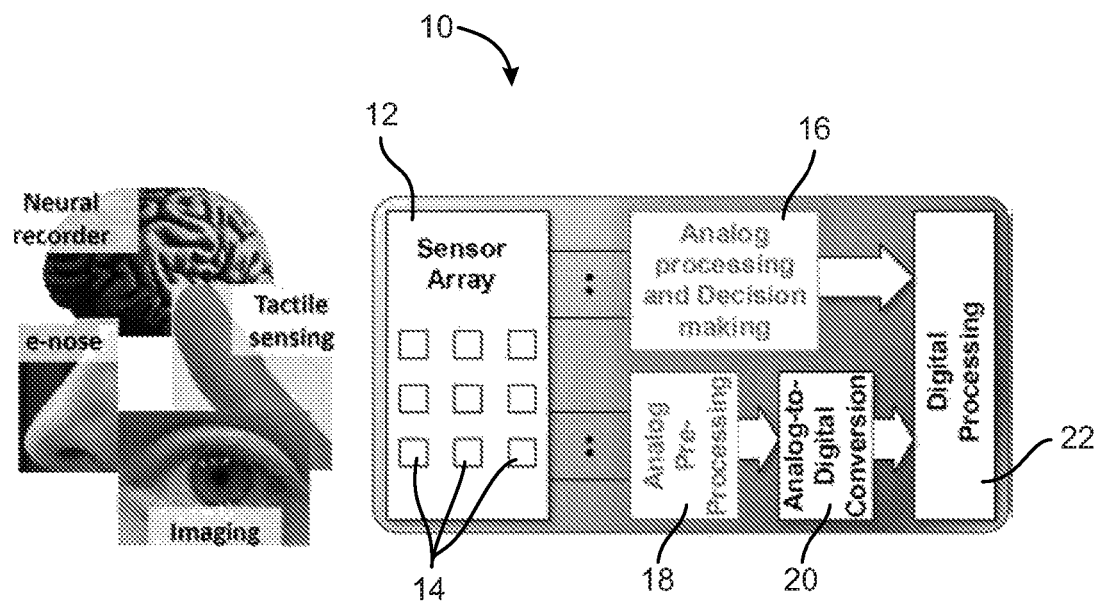
FIG. 1 is a diagrammatic view of an example data collection and processing system

The following description of example methods and apparatus is not intended to limit the scope of the description to the precise form or forms detailed herein. Instead the following description is intended to be illustrative so that others may follow its teachings. It should be noted that, throughout the drawings, many elements that are present in numerous drawings are not labeled with the reference numerals of this disclosure in all figures in which those elements appear. This is for clarity of illustration only.

Tunnel field-effect transistors ("TFETs") are one of the promising candidates for the post-CMOS era, primarily because of their steep-slope $I_{DS}$-$V_{GS}$ characteristic (i.e., small sub-threshold swing) relative to other transistor types. The power-speed tradeoff of conventional analog and digital TFET-based circuits is known, according to which the instant inventors have appreciated their potential for the effective use of TFETs in low-power and low-voltage circuits. Known circuits are generally limited to drop-in replacement of MOSFETs with the new transistors. New topologies and new functionalities that benefit from the signature properties of TFETs, however, are generally not known.

One interesting application domain for emerging technologies, such as TFETs, is non-Von-Neumann architectures. Several nontraditional computational paradigms have been proposed throughout the years. Amongst them, artificial neural networks ("ANNs") and cellular neural networks ("CNNs") have been extensively studied. Numerous applications in electrical engineering, especially in areas such as pattern recognition, have been explored. ANNs and CNNs are constructed by interconnecting primary functions or nonlinear elements (i.e., neurons) to each other, where the interconnects (i.e., synapses) each have a gain or weight. Such networks provide one example context for the potential of emerging devices, such as TFETs, due to the different characteristics of TFETs as compared to CMOS transistors. Networks of nonlinear elements, such as ANNs and CNNs, can be helpful in applications ranging from collecting data from biomedical sensors to robotics/humanoids, wherein large amounts of data should be gathered and processed.

FIG. 1 is a diagrammatic view of an example data collection and processing system 10. The system 10 includes a sensor 12 having an array of detectors 14 having analog output. For visual clarity, not all detectors 14 are designated in FIG. 1. The sensor 12 may be, for example, configured to detect light, sound, pressure, electrical impulses or signals, or any other appropriate input. The system 10 further includes an analog processing and decision-making circuit 16, an analog pre-processing circuit 18, an analog-to-digital converter 20, and a digital procession module 22. The analog pre-processing circuit 18 and/or analog processing and decision-making circuit 16 may include, for example, a diffusion network such as one of the example diffusion networks disclosed herein or another analog circuit disclosed herein. Such analog processing 16, 18 may significantly reduce the workload of the digital processing module 22 and/or improve the function of the digital processing module 22 (e.g., by smoothing an image in the analog domain such that digital edge detection is more accurate due to less noise in the image). The analog pre-processing circuit 18 and/or analog processing and decision-making circuit 16 also includes, in certain examples, one or more voltage sources used to, for example, control one or more gate voltages of the TFETs and other transistors in the circuits. The voltage source(s) are controlled, in examples, to set the resistances or other characteristics of transistors in the circuits. The voltage sources are DC voltage sources, in certain examples.

Although illustrated in FIG. 1 as a 3×3 array, the sensor 12 may include any number and configuration of detectors 14. The detectors 14 may be arranged in a one-dimensional or two-dimensional matrix, and that matrix may be symmetric or asymmetric.

Application of TFETs in CNNs has previously been explored by realizing the nonlinear element of the cell by TFET(s). However, the complexity and power dissipation of known TFET-based CNNs is still dominated by the linear synaptic interfaces (often implemented by transconductance amplifiers). In fact, straightforward replacement of MOSFETs with TFETs in a conventional CNN has resulted in a loss of power efficiency (e.g., 0.03 giga-operations per second per Watt (GOPS/W) using 45 nm SiGe TFETs, in one known case, as compared to 82 GOPS/W in a comparable 350 nm CMOS; this reduction results from the low on-current of the SiGe TFETs.

The instant disclosure includes example CNN-like networks that may be implemented in the analog processing and decision-making circuit and/or the analog pre-processing circuit that have nonlinear synaptic circuits based on the signature characteristics of tunneling transistors. The example circuits can be used, for example and without limitation, for filtering, calculating average, variance, minimum/maximum, and/or as a part of motion estimation or feature extraction algorithms. Such signal processing operations may require significant computational power, if performed by classical digital processors, and hence the example circuits of this disclosure may provide improved processing efficiency over known devices.

First, a description of tunneling devices, including both TFETs and SymFETs, is provided below. Next, example methods and circuits for exploiting the characteristics of the tunneling devices will be disclosed. In particular, example novel applications for the tunneling devices in filtering using diffusion networks will be disclosed, followed by example novel applications that utilize tunneling transistors for pattern classification in associative memories (AMs), followed by example novel applications using TFET-based circuits for finding minimum and variance, which teachings may be extrapolated to other arithmetic operations.

Figure 2A:
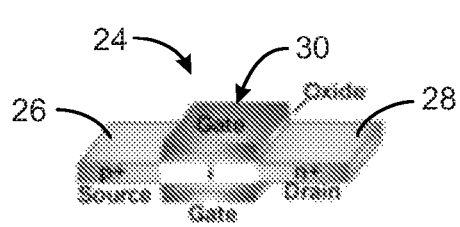
FIG. 2(a) is a schematic view of an example tunneling field-effect transistor (TFET).

Tunneling Devices—TFET. TFETs are a class of FETs in which the charge transport mechanism is based on band-to-band tunneling. FIG. 2(a) is a diagrammatic view of the structure of an example n-type TFET 24 (or "NTFET" 24). As shown in FIG. 2(a), the NTFET 24 includes a source 26 and a drain 28 that are oppositely doped—i.e., a p-type source 26 and an n-type drain 28—along with a metal-oxide-semiconductor gate and channel structure 30.

Figure 2C:
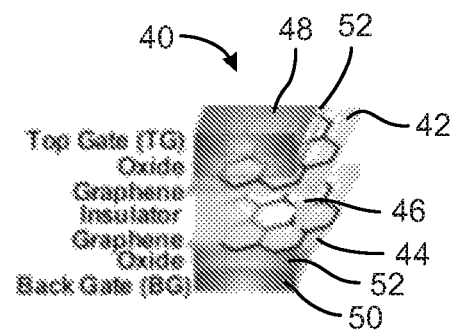
FIG. 2(c) is a diagrammatic view of the structure of a TFET.
Figure 2B:
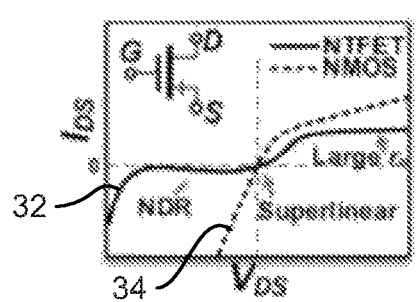
FIG. 2(b) is a plot illustrating comparative I-V characteristics of a TFET with a n-type metal-oxide-semiconductor (NMOS) transistor.

The physical and operating characteristics of a TFET are different from a conventional MOSFET. First, a TFET is an asymmetric device (the source and drain terminals are oppositely-doped, as noted above, and thus not interchangeable). Next, the I-V behavior is different from that of a MOSFET. FIG. 2(b) is a plot illustrating the differences. FIG. 2(b) includes a first plot line 32 of the I-V behavior of an NTFET, and a second plot line 34 of the I-V behavior of an NMOS. As shown in FIG. 2(b), for a negative $V_{DS}$, an NTFET might show negative differential resistance (NDR). For a small $V_{DS}$, a TFET has a superlinear region with a relatively large and nonlinear resistance. A TFET also has a large output resistance in the saturation region.

The TFET-based circuits of this disclosure can employ a variety of TFET technologies, regardless of device material and structure. However, for purposes of discussion and illustration, example TFETs employing III-V materials will be described. Such transistors may provide certain advantages over other TFETs. First, III-V TFETs have a large on-current relative to other TFETs. Second, high-sensitivity photodetectors are realizable in TFETs utilizing III-V materials, and monolithic integration of III-V photodetectors and TFETs (e.g., such as in the applications illustrated diagrammatically in FIG. 1) may find use in high-performance image-processing platforms. It should be noted, however, that the instant disclosure is not limited to the example TFETs utilizing III-V materials; other appropriate materials may be used in other examples.

To the extent that simulation results are given in this disclosure, unless otherwise noted, such results are based on an example TFET derived from TCAD simulation of a 14 nanometer (nm) node InAs double-gate (FinFET) TFET with a gate length of 20 nm and an equivalent oxide thickness (EOT) of 0.7 nm. TCAD simulation results are look-up tables that describe the device current ($I_{DS}$) and capacitances ($C_{GD}$ and $C_{GS}$) versus terminal voltages. Verilog-A, a known hardware description language, was used to read these tables in simulations with SPICE, a well-known circuit simulation program. The instant disclosure applies mismatch coefficients $A_{TH}$=1 mV·μm and $A_{β}$=0.01 μm; these coefficients were derived from technology trends for CMOS devices and the International Technology Roadmap for Semiconductors. Unless otherwise stated, the results presented in the rest of this disclosure are products of SPICE simulation.

Figure 2D:
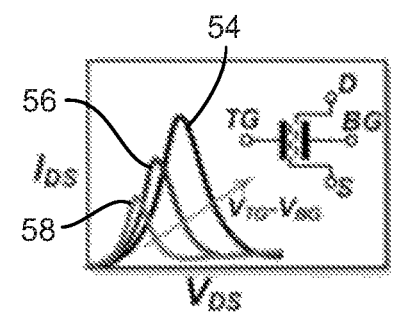
FIG. 2(d) is a plot illustrating I-V characteristics of an example TFET according to different gate voltages.

Tunneling Devices—SymFET. A symmetric graphene-insulator-graphene FET (SymFET) 40, also known as double-layer Graphene transistor, is shown in FIG. 2(c). In a SymFET, tunneling occurs between two two-dimensional ("2-D") materials, a p-type graphene layer 42 and an n-type graphene layer 44, separated by a thin insulator 46. The SymFET has a top gate 48 and a back gate 50, which are separated from the grapheme layers 42, 44 by respective layers of oxide 52. The SymFET has relatively unusual characteristics. FIG. 2(d) illustrates the I-V characteristics of an example SymFET. As shown in the three plot lines 54, 56, 58 of FIG. 2(d), which illustrate the I-V characteristic of the example SymFET for various gate voltages, the $I_{DS}$–$V_{DS}$ relationship of the SymFET shows a strong NDR region, resembling that of resonant tunneling diodes. This behavior has been experimentally observed as well.

The I-V characteristic of simulated SymFETs used in this disclosure is derived from an example SymFET having an EOT of 1 nm, and 1.34 nm of Boron Nitride (four layers of h-BN) between undoped graphene sheets. For SPICE simulation, Verilog-A read tabular I-V data. Three planar capacitances (between TG-S, D-S, and BG-D terminals) were accounted for in simulation. The area of the simulated SymFETs was kept above 100 nm×100 nm; edge effects were not fully accounted for. Below, in this disclosure, performance of 100-nm SymFET technology will be compared with 0.13-μm CMOS technology, as the two technologies require similar lithographic precision.

Methods for building digital circuits (such as Inverter, NAND, NOR, etc.) using SymFETs is known. However, conventional analog circuits, comprising high-quality switches and current sources, including SymFETs have not been designed. In one example, an analog circuit comprises a complete graphene-based platform that includes SymFET transistors as well as other transistor types, such as graphene nanoribbon TFETs with conventional I-V characteristics, for example, as well as graphene-based sensors such as photodetectors and pressure sensors, for example. For the remainder of this disclosure, an FET with conventional characteristics—known to a person of skill in the art—will be used in auxiliary circuits, although such a device will not impact the SymFET-based circuits of this disclosure.

Furthermore, it should be noted that the instant disclosure is not limited to the specific tunneling technologies explicitly described in the example circuits. Instead, a person of ordinary skill in the art will appreciate that other tunneling devices, such as BiSFET and SET, in which the bell-curve characteristic of SymFET has been observed, may also find use in the disclosed circuits and techniques.

TFET-Based Diffusion Networks. Diffusion networks are a class of CNNs built as a one-dimensional ("1D") or two-dimensional ("2D") matrix of resistors and capacitors. FIG. 3(a) is a diagrammatic view of a partial diffusion network 60 having a plurality of resistors 62 and a plurality of capacitors 64 electrically coupled to a plurality of nodes 66. For clarity of illustration, not all resistors 62, capacitors 64, or nodes 66 are designated in FIG. 3(a). The resistors 62 are arranged in a 2D matrix, with each capacitor 64 electrically coupled between a respective node 66 of the matrix and ground. Each resistor 62 may be implemented with one or more TFETs 68, in the manner set forth in numerous examples below. Each TFET 68 may include one or NTFETs 30, SymFETs 40, or another appropriate type of TFET. Accordingly, each node may include an electrical coupling of a drain of one TFET 68 (e.g., in a 1D network) or two TFETs 68 (e.g., in a 2D network, or with parallel or anti-parallel TFETs), a source of one TFET 68 (e.g., in a 1D network) or two TFETs 68 (e.g., in a 2D network, or with parallel or anti-parallel TFETs), and a capacitor 64. Referring to FIGS. 1 and 3(a), if the diffusion network 60 were implemented in one of the analog circuit portions 16, 18 of the example system 10, each node 66 of the diffusion network 60 receives a single analog input (i.e., each node 66 may be electrically coupled to a respective detector 14 of the sensor 12) and a single output may be measured (or sampled) across each capacitor 64 after a predetermined period of time. The collective measured voltages may be assembled into the output of the diffusion network 60, and that output may be passed on for digital conversion and/or processing, in an example. In the example of the system 10 implementing the diffusion network 60, the number of nodes 66 and arrangement of nodes 66 matches the number of detectors 14 in the sensor 12. Of course, in other examples, the network 60 may be arranged and/or coupled to the sensor 12 in another appropriate manner.

The equation that relates the voltage of each capacitor 64 in the network 60 to its neighbors is the well-known linear diffusion equation, shown as equation (1) below:

$$\frac{\partial V}{\partial t} = \nabla(D\nabla V) \quad (1)$$

where D is the diffusion coefficient. The discrete-space diffusion in a 2D network is expressed as equation (2) below:

$$\tau \frac{\partial V_{i,j}}{\partial t} = \nabla^2 V = V_{i-1,j} + V_{i+1,j} + V_{i,j-1} + V_{i,j+1} - 4V_{i,j} \quad (2)$$

where $V_{i,j}$ is the voltage of the capacitor in row i and column j, and $\tau = RC$ is the time constant of the network $(=1/D)$.

The diffusion process can be used to approximate a Gaussian smoothing filter, widely used in image processing applications. It is a spatial filter often utilized for de-noising, blurring, and/or reducing the amount of details in an image prior to other processing tasks such as edge detection, multi-resolution representation, and Gaussian pyramid generation. While the filtering process can be performed in a digital processor, it may require complicated arithmetic operations and may consume considerable power. The example analog diffusion network 60 of FIG. 3(a) may be applied to realize the spatial filter with minimum overhead in terms of hardware and power dissipation. In the example analog diffusion network 60 of FIG. 3(a), the energy dissipated by the resistors 62 comes from the energy that is initially delivered to the network 60 by charging the capacitors 64, i.e., the input signal or signals input at each node 66. For example, in vision chips, the capacitors 64 of the diffusion network 60 are charged by the photo-current. FIG. 3(b) illustrates an example of this charging. Referring to FIG. 3(b), the capacitor 64 and a photo-diode 70 are first reset to a high voltage and then the photo-current is integrated through a switch 72, gradually discharging the capacitor 64. Subsequently, the photo-diode 70 is disconnected from the capacitor 64 and the diffusion process can start.

Referring again to FIG. 3(a), the resistors 62 of the example network 60 have been known to be implemented by MOSFETs operating in the linear (triode) region. In such an application, the gate voltage of the MOSFET can be used to adjust or enable/disable the diffusion process. Moreover, diffusion networks are robust against fabrication nonidealities, such as device mismatches, relative to conventional CNNs. In an example, instead of MOSFETs, the example diffusion network may be built with tunneling devices. Example diffusion networks constructed from tunneling devices are disclosed below.

TFET-Based Diffusion Network. As shown in FIG. 2(b), TFETs exhibit asymmetric conduction; when used as a resistor, the drain-source resistance of an NTFET 30 is lower when current is flowing in the drain-to-source direction. Accordingly, if the resistors 62 in the example diffusion network of FIG. 3(a) are implemented with NTFETs 30, for example, the diffusion process will be influenced by the asymmetry of the TFET. Considering two adjacent nodes of the network 60, the diffusion constant will be higher in one direction compared with that of the opposite direction. This makes it possible to realize directional diffusion networks.

The impact of the directionality can be observed in the partial schematic views of example 1D networks 74, 76, 78 shown in FIG. 4(a) (a network 74 implemented with MOSFETs 100 (all MOSFETS, including CMOS components, are referenced with numeral 100 herein)), 4(b) (a NTFET-based network 76), and 4(c) (a so-called NPTFET-based network 78, in which each resistor includes a PTFET 84 in parallel with an NTFET 30, such that the conduction directions of the two transistors align with each other). Although only three nodes 66 are shown in each of FIGS. 4(a), 4(b), and 4(c), a network can include any number of nodes 66 as required by the input of the implementation. FIG. 4(d) is a plot illustrating example noisy input 80 and noiseless input 82 for a 1D, 64-node network. The input 80 sets the initial voltages of the capacitors 64 in the network. The initial voltages of the capacitors in the network can be considered to be coming from 64 inputs (e.g., 64 sensors). Alternatively, the network may be used to filter 64 consecutive samples (in time) of a single input. In either case, the network smooths the noisy inputs.

FIG. 4(e) is a plot illustrating the outputs 86, 88, 90 of the TFET-based networks 76, 78 and the MOSFET-based network 74 of FIGS. 4(a), 4(b), and 4(c), respectively. As shown in FIG. 4(e), the rising edge of the output waveform is preserved better by the TFET-based circuits; this results from the diffusion speeds of the TFET-based networks 76, 78 in the backward direction from the ith node to the (i-1)th node. By interchanging the source and drain terminals of the TFETs 30, 84 in FIGS. 4(b) and 4(c) from those illustrated, the networks 76, 78 would similarly preserve the falling edge of the output waveform.

Figure 5A:
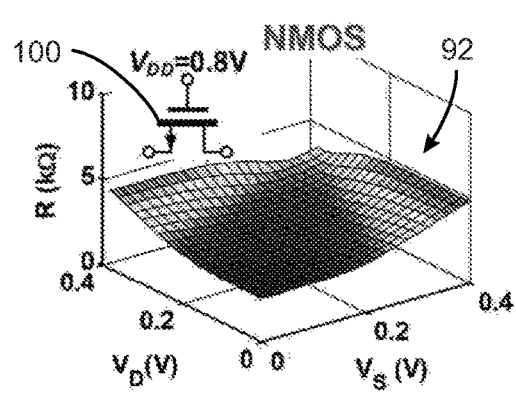
FIGS. 5(a)-5(d) are plots illustrating the resistances, over a range of source and drain voltages, for NMOS, NTFET, parallel n-type TFETS (NNTFET), and NPTFETs, respectively.
Figure 5B:
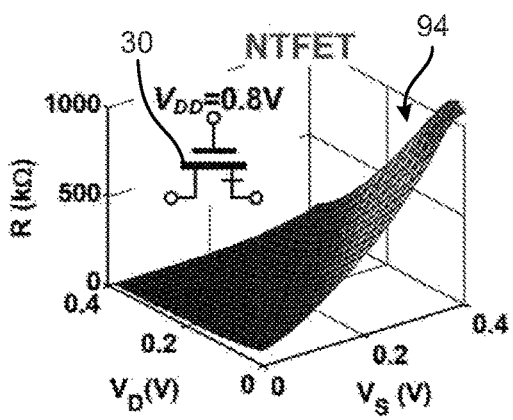
Figure 5C:
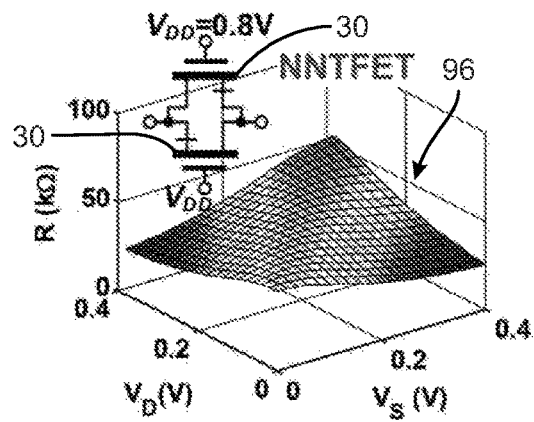
Figure 5D:
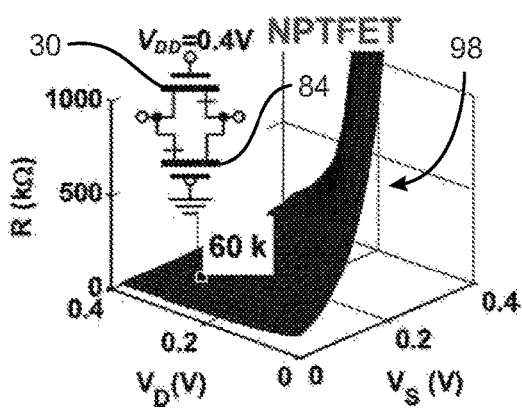

FIGS. 5(a)-5(d) are plots illustrating the respective resistances of MOSFET-based and TFET-based resistors, with FIG. 5(a) illustrating the resistance 92 of an NMOS resistor 100, FIG. 5(b) illustrating the resistance 94 of an NTFET-based resistor 30, FIG. 5(c) illustrating the resistance 96 of an NNTFET-based resistor (including two NTFET transistors 30), and FIG. 5(d) illustrating the resistance 98 of an NPTFET-based resistor (including an NTFET 30 and a PTFET 84). The NMOS resistor examined in FIG. 5(a) is based on a 14 nm CMOS PTM model with a gate length of 20 nm. Unless otherwise noted, example NMOS components 100 throughout this disclosure are based on the same model.

Referring to FIGS. 5(a)-5(d), a MOSFET 100 offers an almost constant resistance when gate-source voltage is relatively large (e.g., when $V_S$ and $V_D$ are below 0.2 V, as shown in FIG. 5(a)). A single NTFET 30 has an asymmetric resistance, as explained above and as shown in FIG. 5(b). This asymmetry can be eliminated by anti-parallel placement of two NTFETs 30, the resulting resistance of which is shown as "NNTFET" in FIG. 5(c). Alternatively, the asymmetry can be magnified by placing a PTFET 84 in parallel with an NTFET 30, such that the conduction directions of the two transistors align with each other, the resulting resistance of which is shown as "NPTFET" in FIG. 5(d).

More generally, two NTFETs 30 and two PTFETs 84 can be placed in parallel between every two nodes of an example network. Depending on whether directionality is required or not, one or more transistors can be disabled by controlling gate voltages of individual transistors so as to allow for a single NTFET 30 or a single PTFET 84 to operate as the resistor for asymmetrical operation, two NTFETs 30 or two PTFETs 84 to operate as the resistor for symmetric operation, or a single NTFET 30 and a single PTFET 84 to operate in conjunction for magnified asymmetry in the resistance of the resistor. In such an example, multiple separate voltage sources may be provided for separately controlling the gate voltages of the various TFETs.

In many image processing applications, the frame rate is low and the time constant of the diffusion network can be large. For example, if the frame rate of image capture is 30 frames per second (fps), any time constant smaller than a few milliseconds may be acceptable. This is attainable using practical values of R (for example, a few tens of kΩ) and C (for example, a few tenths of a pF), which result in a diffusion time constant in the nanosecond (ns) range. A relatively large time constant (compared with the frequency of the clock that used in the diffusion network control unit) allows for better control over the diffusion process. The time constant can be increased by raising either the resistances or the capacitances of the diffusion network, both of which adversely affect the chip area. As illustrated in FIGS. 5(a)-5(d), the resistance of a TFET-based resistor is generally higher than that of a similarly-sized MOSFET 100. This is a consequence of the lower on-current in TFETs relative to MOSFETs and also the different characteristics of the respective superlinear regions of MOSFETs and TFETs. This difference between MOSFETs and TFETs may thus be leveraged for more area-efficient implementation of a diffusion network.

Figure 6A:
FIGS. 6(a) and 6(b) are an original image and the original image after smoothing through an example diffusion network, respectively.
Figure 6B:
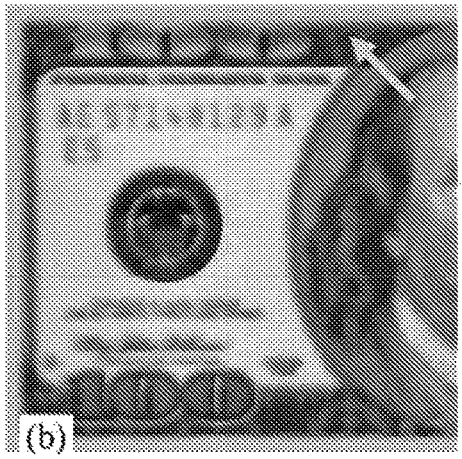

One example application of a diffusion network, such as the diffusion network 60 of FIG. 3(a), is image smoothing. For example, referring to FIG. 1, the sensor 12 may be a camera with a grid of photodetectors. FIG. 6(a) is an example image 102 that may be captured with such a sensor 12. FIG. 6(b) is the image 102 of 6(a) after smoothing through a simulated (via SPICE) example TFET directional diffusion network with a diffusion time of 10 nanoseconds (ns) (i.e., a smoothed image 104). Comparing FIG. 6(a) with FIG. 6(b), it can be seen that certain edges (e.g., those perpendicular to the diffusion direction) are less affected by the smoothing process. Thus, the directionality of the diffusion network has practical effects. To obtain different results, the diffusion time may be altered; for example, the diffusion time may be altered by orders of magnitude simply by changing the effective widths of the TFETs comprising the resistors in the diffusion network.

Directional diffusion is useful in many real-world applications such as, for example, correcting an original noisy image that has directional texture (e.g., many horizontal lines). Another example application is performing diffusion prior to a directional operation, such as shadowing or connected component detection in order to limit the smoothing to a desired direction. In another example, in video processing, the gradient (derivatives) of the input images may be used to find the optical flow, and utilizing directional diffusion may enhance optical flow in the desired direction.

Directionality can be incorporated in CMOS-based diffusion networks, as well. FIG. 7(a) includes two schematics of a portion of an example TFET-based network 110 and an example diode-connected MOSFET-based network 112. Capacitors are not shown in either network portion 110, 112 in FIG. 7(a), but would be present in the broader networks of which the network portions are a part. FIG. 7(b) is a plot having two plot lines 114, 116 that illustrate the I-V characteristics of the TFET network portion 110 and the diode-connected MOSFET network portion 112, respectively. As shown in FIG. 7(b), The TFET-based network 110 starts to conduct as soon as $V_1-V_2$ is positive. In the CMOS-based network 112, $V_1-V_2$ needs to get to the threshold voltage of MOSFET M1 (see FIG. 7(a)) before conduction starts. Therefore, for a small positive $V_1-V_2$, the diffusion process will not take place in a network based on the diode-connected MOSFET. As a result, the TFET-based network 110 may be preferred, for example, in spatial smoothing.

SymFET-Based Diffusion Network. Referring again the example network 60 of FIG. 3(a), if the resistors 62 of the network have a special nonlinear I-V characteristic, the smoothing operation can preserve the edges of the original image; this is known as anisotropic, or Perona-Malik, diffusion. Such nonlinear diffusion networks may find use in, for example, medical imaging and in computer-aided quality control, segmentation of textures, subsampling algorithms, and remote data sensing.

FIG. 8(a) is a plot having two plot lines 118, 120 that illustrate the resistance of a nonlinear resistor 122 and the resistance of a resistive fuse, respectively. As shown in FIG. 8(a), the current passing through the nonlinear resistor 122 is significantly lower than that of a linear R when the voltage difference across the resistor is large (which equates, in one example, with the edges of an image, where adjacent pixels have widely different intensities). Anisotropic diffusion can be implemented in the analog domain by building an active resistor (i.e., a resistive fuse) using several MOSFETs or in the digital domain by implementing functions such as $f(x) = e^{-ax^2}$.

A SymFET has a bell-curve characteristic that is, to some extent, similar to the desired resistance profile 118 of a nonlinear resistor illustrated in FIG. 8(a). In one example, a nonlinear resistor is symmetric and provides less conduction for large drain-source differences, independent of the common-mode level of the drain and source voltages. A SymFET with its top-gate and back-gate shorted provides this behavior. FIG. 8(b) includes a schematic view of a SymFET 130 and a plot having three plot lines 132, 134, 136 illustrating the I-V profile of a SymFET with varying gate voltages of 0, 0.6, and 1.2 volts, respectively. FIG. 8(c) is a plot 138 illustrating the current through the SymFET over different source and drain voltages. As shown in FIGS. 8(b) and 8(c), while the current decreases for large drain-source voltages, it does not approach zero, making anisotropic diffusion less effective. However, the current is still significantly smaller than that of a linear resistor (with a similar resistance at $V_{DS}=0$.

FIGS. 9(a) and 9(b) illustrate the results of the image of FIG. 6(a) being filtered through isotropic diffusion (smoothed image 140) (FIG. 9(a)) and SymFET-based anisotropic diffusion (smoothed image 142) (FIG. 9(b)). In comparing the images 140, 142, it can be seen that the SymFET-based anisotropic diffusion is superior in edge preservation.

FIGS. 10(a)-10(c) illustrate another example application of a diffusion process, where diffusion is used to eliminate the noise from a picture prior to edge detection. While both isotropic and anisotropic diffusions remove the impact of the noise, the final image after the anisotropic diffusion includes more detail. FIG. 10(a) illustrates an original image 144, above, and the results of Sobel edge detection 146 on the original image, below. FIG. 10(b) illustrates the image after applying isotropic diffusion 148, above, and the results of Sobel edge detection 150 on that image, below. FIG. 10(c) illustrates the image after applying anisotropic diffusion 152 with a SymFET-based network, above, and the results of Sobel edge detection 154 on that image, below. As can be seen by comparing the three edge detection results 146, 150, 154, both diffusion processes reduce noise and increase the accuracy of the edge detection, and the SymFET-based anisotropic diffusion offers superior results over the isotropic diffusion (e.g., compare the detected edges of the boat, circled in both FIGS. 10(b) and 10(c)).

A comparison among diffusion elements is given in Table 1, below. The CMOS-based resistive-fuses are active circuits, whereas the SymFET-based nonlinear element is fully passive, resulting in no extra power dissipation in the cell. For example, at a resolution of 128×128 pixels, the power consumption of nonlinear elements in one example network may be 32 µW. In comparison, a 128×128 pixel motion sensor chip that uses passive isotropic diffusion may consume only 1.1 µW total at the same frame-rate (30 fps) and using the same fabrication technology (130 nm).

TABLE 1

| Type/Ref. | Technology | Number of transistor | Power per element (µW) |
| --- | --- | --- | --- |
| Anisotropic | SymFET | 1 | Passive |
| Isotropic/[24] | CMOS 0.35 µm | 1 | Passive |
| Anisotropic/[33] | CMOS 2 µm | 11 | 2.5[†] |
| Anisotropic/[34] | CMOS 0.13 µm | >30 | 0.002*[†] |

*at 30 fps (mostly dynamic power dissipation and changes with frame-rate)
[†]Only the power consumed by the active part of the nonlinear element.

SymFETs also offer compactness and power advantages over known nonlinear circuit elements. For example, a SymFET-based resistive fuse can take up less than 1 µm$^2$, which is significantly smaller than competing known elements. Because SymFETs facilitate a more compact cell design, the length of the interconnects can be reduced, resulting in lower parasitic capacitances for the control signals, and hence a lower dynamic power dissipation.

The processing time of the network is proportional to $R_0C$, where $R_0$ is indicated in FIG. 8(a). For CMOS-based resistive fuse circuits, lowering $R_0$ results in higher power dissipation and chip area. In SymFET-based networks, the size of the transistor determines $R_0$. A processing time below 100 ns has been observed from SPICE simulation for as large as 1 pF and a SymFET area of 0.1 µm$^2$. This satisfies not only typical frame rate of 30 fps, but also high-performance applications running at tens of kfps.

Figure 20A:
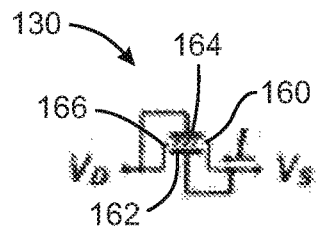
FIGS. 20(a)-(c) are schematic views of example arrangements of SymFET-based resistors that may be used in the diffusion network of FIG. 3(a).

Referring again to FIG. 3(a), an example of the diffusion network 60 can be implemented with SymFETs forming the resistors 62 in many different configurations. For example, as illustrated in FIG. 20(a), each SymFET 130 in the network 60 may be configured such that its source 160 is electrically coupled to a first of its gates 162, and its other gate 164 is electrically coupled to the drain 166. This configuration provides a fixed I-V characteristic of the SymFET 130.

Figure 20B:
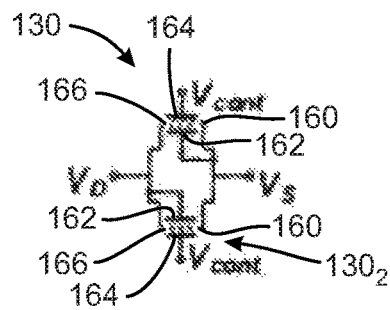

FIG. 20(b) illustrates another example configuration, in which each resistor 62 of the network 60 comprises two SymFETs 130$_1$, 130$_2$ in an anti-parallel configuration. One SymFET 130$_1$ has a gate 162 electrically coupled to its source 160, and the other SymFET 130$_2$ has a gate 162 electrically coupled to its drain 166. The second gates 164 of each SymFET 130 are electrically coupled to a control voltage $V_{cont}$. The drains 166 of the two SymFETs 130$_1$, 130$_2$ are electrically coupled to each other, and the sources 160 of the two SymFETS 130$_1$, 130$_2$ are electrically coupled to each other. In this configuration, the resistor formed by the anti-parallel SymFETs 130$_1$, 130$_2$ has a symmetric resistance.

Figure 20C:
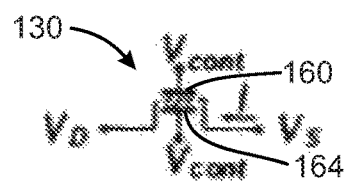

FIG. 20(c) illustrates another example configuration; each SymFET in the network may be configured such that both gates 162, 164 of each SymFET 130 are electrically coupled to a control voltage $V_{cont}$. In both the configuration of FIG. 20(c) and the configuration of FIG. 20(b), the I-V characteristic of the resistor can be controlled by altering the value of the control voltage $V_{cont}$.

In examples including a control voltage $V_{cont}$ applied to one or more transistors of the network 60 of FIG. 3(a), a common control voltage is applied to all similarly-disposed gates, in one example. That is, in the configuration of FIG. 20(b), a single common control voltage may be applied to every SymFET 130; in the configuration of FIG. 20(c), a first common control voltage can be applied to the top gate 164 of each SymFET 130, and a second common control voltage can be applied to the back gate 166 of each SymFET 130. Of course, this disclosure is not limited to one or two common control voltages. In other examples, sub-portions of the diffusion network have separate control voltages from other sub-portions of the diffusion network.

Figure 20D:
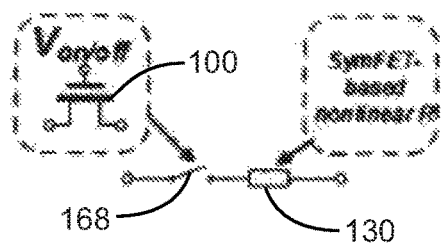
FIG. 20(d) is a schematic, diagrammatic view of a switching mechanism for electrically coupling a resistor, such as a TFET-based resistor, with a node.

FIG. 20(d) illustrates another example implementation of a diffusion network that may be used in conjunction with any TFET-based network of this disclosure. As illustrated, a TFET-based resistor (FIG. 20(d) illustrates a SymFET 130, but the concept is not limited to SymFETs) may be electrically coupled to a node through a switch 168. The switch is a MOSFET 100 in the example, but other appropriate switching mechanisms may be used.

In summary, the diffusion network 60 in FIG. 3(a) may be implemented with TFETs, such as SymFETs 130, serving as the resistors 62 of the network 60. The TFETs may be disposed in many different arrangements (e.g., such as those shown in and described with respect to FIG. 4(b), 4(c), 7(a), 20(a), 20(b), or 20(c)). The network 60 may be arranged such that each non-edge node 66 is the same; that is, each node is electrically coupled to a capacitor and the same terminals of the same number of TFETs. The TFETs may be accompanied by other elements, such as switches 168 (see FIG. 20(d)). Such networks 60, when used for smoothing analog input, can improve upon both non-smoothed input and on known methods of smoothing as illustrated in and described with respect to FIGS. 4(e), 6(a), 6(b), and 9(a)-10(c).

Analog or Multi-Valued Associative Memory. Associative Memories ("AMs") are content-addressable memories that are generally used in pattern recognition, feature extraction, and classification, and have been discovered by the inventors to be another useful implementation of TFETs. The content of each memory cell is a vector of bits or analog values as m={m$_1$, m$_2$, . . . , m$_K$}. For every input vector r={r$_1$, r$_2$, . . . , r$_K$} the AM circuit finds the memory vector which is the closest to the input vector. The measure of closeness can be, in different non-limiting examples, Hamming distance, Manhattan distance or Euclidean distance. Euclidean distance, which is generally suitable for use in an AM circuit in analog and multi-valued systems, is defined as set forth in equation (3) below:

$$D_{Eucl} = \sqrt{\Sigma_{j=1}^{K}(r_j - m_j)^2} \quad (3)$$

Several realizations of equation (3) are known, but those implementations require complicated circuits. Simpler circuits for finding the distance between input and target patterns are disclosed below.

Figure 11A:
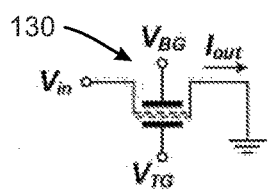
FIG. 11(a) is a schematic view of an example SymFET.
Figure 11B:
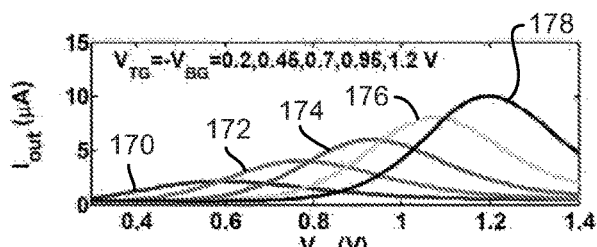
FIG. 11(b) is a plot illustrating the I-V characteristic of the SymFET of FIG. 11(a) for various gate voltages.

Associative Memory Using SymFET-Based Nonlinear Resistors. FIG. 11(a) is a schematic of an example SymFET-based circuit including a single SymFET 130 that provides a parabolic-like function that approximates equation (3). FIG. 11(b) is a plot including five plot lines 170, 172, 174, 176, 178 illustrating respective output currents of the circuit for five different gate voltages of 0.2V, 0.45V, 0.7V, 0.95V, and 1.2V. As shown in FIG. 11(b), for each value of the gate voltage, the output current will have a peak at a different input voltage. As a result, the circuit can be used to find the proximity of the input voltage to a target voltage. However, a shortcoming of this circuit is that the peak value of the current depends on the gate voltage as well. This relationship may not be desirable when multiple transistors are placed in parallel.

Figure 11C:
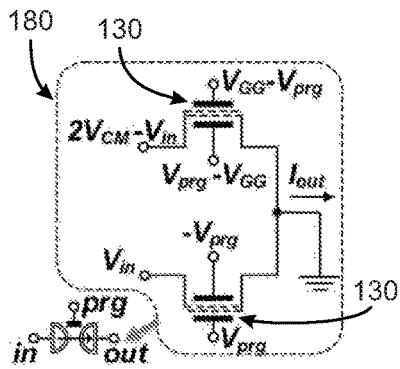
FIG. 11(c) is a schematic view of an example SymFET-based associative memory (AM) cell.
Figure 11D:
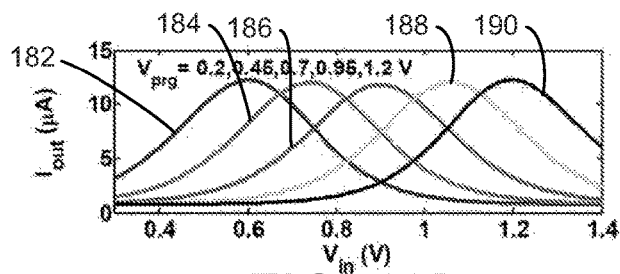
FIG. 11(d) is a plot illustrating the I-V characteristic of the AM cell of FIG. 11(c) for various gate voltages.

FIG. 11(c) is a schematic of an example SymFET-based circuit 180 that overcomes the above-noted shortcoming of the circuit of FIG. 11(a). The example circuit includes two SymFETs 130 and receives differential inputs with a common-mode level of $V_{CM}$. If the example circuit 180 is deployed in a system in which the input sensors do not produce differential outputs, then extra circuitry (not shown) may be provided for single-ended-to-differential conversion. The gate voltages for the circuit of FIG. 11(c) are set such that the peak current of one SymFET 130 is small and the peak current of the other SymFET 130 is large. Hence, one SymFET 130 is set with gate voltages $V_{GG}$-$V_{prg}$ and $V_{prg}$-$V_{GG}$, where both $V_{GG}$ and $V_{prg}$ are provided by a voltage source, and the other SymFET 130 is set with gate voltages -$V_{prg}$ and $V_{prg}$. The peak of the total current has only small variations with the programming gate voltage ($V_{prg}$), as shown in FIG. 11(d), which includes five plot lines 182, 184, 186, 188, 190 illustrating respective output currents of the circuit for the same gate voltages as FIG. 11(b) (i.e., 0.2V, 0.45V, 0.7V, 0.95V, and 1.2V).

Figure 11E:
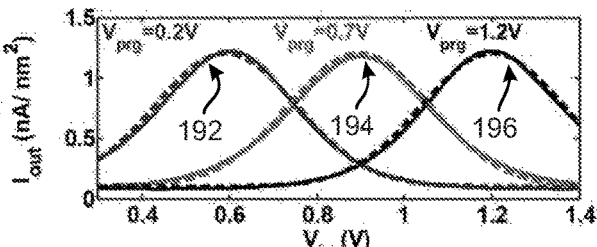
FIG. 11(e) is a plot illustrating the I-V characteristic of the AM cell of FIG. 11(c), normalized to transistor area, for various gate voltages.

The circuit 180 in FIG. 11(c) may be considered a "programmable synapse." It can be used, for example, as the interface between adjacent cells or between inputs and a neuron in CNNs or in feed-forward (perceptron) neural networks (an example of which will be later illustrated in and described with respect to FIG. 13(a)). The input-output relationship of the synapse can be approximated by equation (4) below:

$$I_{out} = I_0 + I_1 \exp\left[-\left(\frac{V_{in} - k_0 V_{prg} - V_0}{V_1}\right)^2\right] \quad (4)$$

where $I_0$, $I_1$, $V_0$, and $V_1$ are device-related coefficients and may be determined by curve fitting. FIG. 11(e) is a plot illustrating, for programming gate voltages of 0.2V, 0.7V, and 1.2V, the simulated (solid lines) and mathematical (dashed lines; determined according to equation (4)) output currents 192, 194, 196 of the circuit 180 of FIG. 11(c), normalized to transistor area, illustrating the close agreement between equation (4) and simulated results.

Figure 12A:
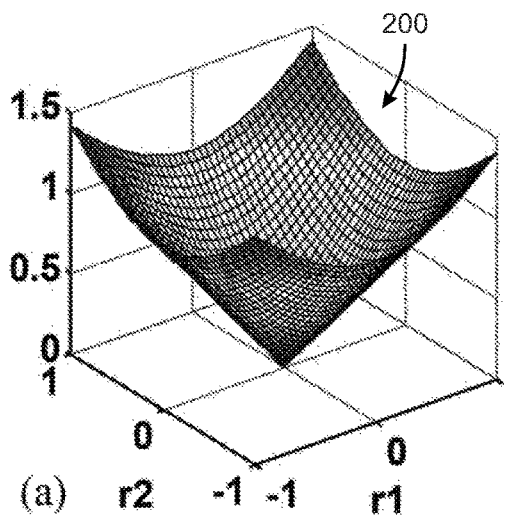
FIG. 12(a) is a plot of an example Euclidean distance equation.
Figure 12B:
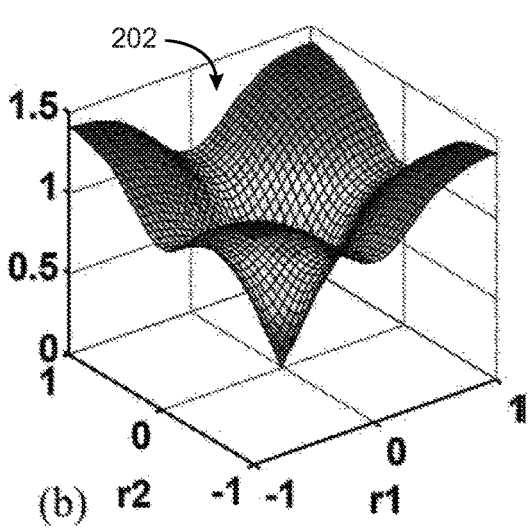
FIG. 12(b) is a plot of an example Gaussian distance equation.

The SymFET-based AM circuit 180 of FIG. 11(c) provides a Gaussian distance between the input and memorized vectors. To do so, $V_{prg,j}$ is set equal to $$\frac{(V'_{in} - V_0)}{k_0}$$

where $V'_{in}$ is an element in the memorized vector. Then, when $V_{in} = V'_{in}$, $I_{out}$, equation (4) will be maximized. This can be demonstrated using a two-cell memory, for example. If it is assumed that the memory contents are $m_1 = m_2 = 0$ for the input vector $\{r_1, r_2\}$, the Euclidean and Gaussian distances are given by equations (5) and (6) below:

$$D_{Eucl} = \sqrt{(r_1^2 + r_2^2)} \quad (5)$$

$$D_{Gaus} = \sqrt{\left(2 - e^{-\frac{r_1^2}{k_1}} - e^{-\frac{r_2^2}{k_1}}\right)} \quad (6)$$

where $k_1$ is a constant. FIG. 12(a) is a plot 200 illustrating Euclidean distance (i.e., equation (5)), and FIG. 12(b) is a plot 202 illustrating Gaussian distance (i.e., equation (6)). Depending on $k_1$, the Gaussian distance can change more or less rapidly than the Euclidean distance as the input vector gets closer to the memorized vector. It should also be noted that, since equation (4) resembles a Gaussian function, it can be used as an activation function in many ANNs or radial basis function networks.

Figure 13A:
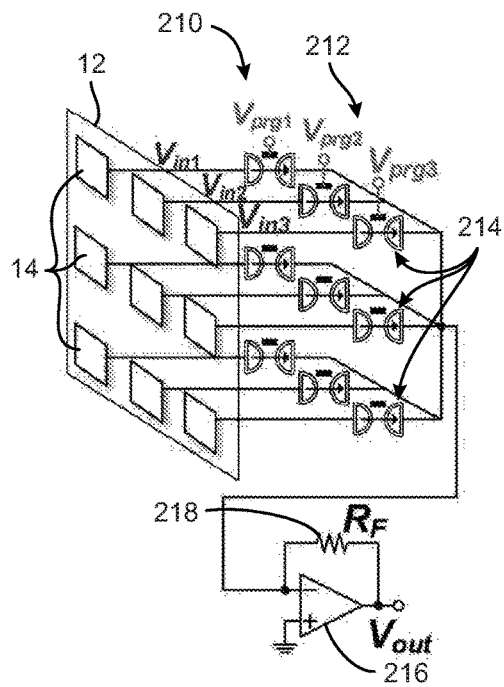
FIG. 13(a) is a diagrammatic view of an associative memory system.

FIG. 13(a) is a schematic illustrating an example associative memory system 210. The system includes a sensor 12 having a plurality of detectors 14 and a circuit 212 comprising an array of associative memory cells 214. Each of the detectors 14 is electrically coupled with one of the associative memory cells 214. The associative memory cells 214 are examples of "programmable synapses" 180 i.e., SymFET-based AM circuits. The system 210 may be used, for example, in pattern recognition. An input vector is applied to the array of associative memory cells 214 (i.e., synapses) through the input sensor 12. Each memory cell 214 is pre-programmable using $V_{prj,j}$ to produce its peak current at a target input voltage (i.e., where the target is the "remembered" data). An operational amplifier (op-amp) 216 with a resistive feedback $R_F$ 218 is used to convert the sum of the synaptic currents to a voltage; that is, the output of each memory cell 214 is electrically coupled to the output of every other memory cell 214 and to one of the terminals of the op-amp 26. The magnitude of the output voltage for the array is given by equation (7), below:

$$|V_{out}| = R_F \sum_{j=1}^{K}\left[I_0 + I_1 e^{-\left(\frac{V_{in,j} - k_0 V_{prg,j} - V_0}{V_1}\right)^2}\right] \quad (7)$$

where K is the number of synapses or memory cells 214 (9, in the example system 210 of FIG. 13(a), though of course any number of synapses may be used as appropriate for the input of a particular application).

Figure 13B:
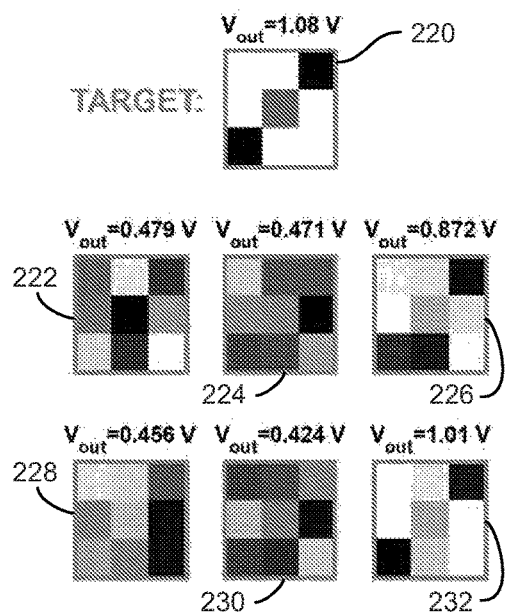
FIG. 13(b) illustrates a target image and various input images that may be used with the system of FIG. 13(a).

FIG. 13(b) illustrates an example target input pattern 220; in this example, the programming gate voltages $V_{prg}$ are set such that the magnitude of the output signal is maximized for the target input pattern 220. In this example, the input voltage range is from 0.6 V to 1.2 V, with 0.6 V represented by white in FIG. 13(b) and 1.2 V represented by black. That is, $V_{prg,j}$ is set equal to $$\frac{(V'_{in,j} - V_0)}{k_0}$$

where $V'_{in,j}$ is the input voltage corresponding to the jth pixel in the target image. The maximum value of equation (7), which occurs if $V_{in,j} = V'_{in,j}$ for all j, is equal to $KR_F(I_0 + I_1)$ where $R_F$ is the feedback resistor shown in FIG. 13(a). The respective output voltages $V_{out}$ for six other respective input patterns 222, 224, 226, 228, 230, 232 are given in FIG. 13(b). The last image 232, which is closest to the target image 220, generates the largest output voltage magnitude, as expected. These results have also been validated by SPICE simulation. For example, the output magnitude corresponding to the target image 220 and the last image 232 in FIG. 13(b) were found to be 1.09 V and 1.02 V, respectively, in simulation.

If the area of a SymFET used to construct the circuit 212 of FIG. 13(a) is small, its parasitic capacitances may also be small, and the capacitance at the common node of the memory cells 214 in the array of FIG. 13(a) may thus be dictated by that of the wirings and the input capacitance of the op-amp 216. Increasing the area of a SymFET would lower its average resistance, and hence the settling time of the circuit can be improved. If the area of the SymFET is very large, its parasitic capacitance will determine the speed of the circuit and increasing its area will no longer improve the settling time, as its resistance will change inversely proportionally to its capacitance. Accordingly, one of skill in the art will appreciate that the size of the SymFETs in the circuit 212 may be designed at an appropriate size for an appropriate settling time.

Figures 13C, 13D, 13E:
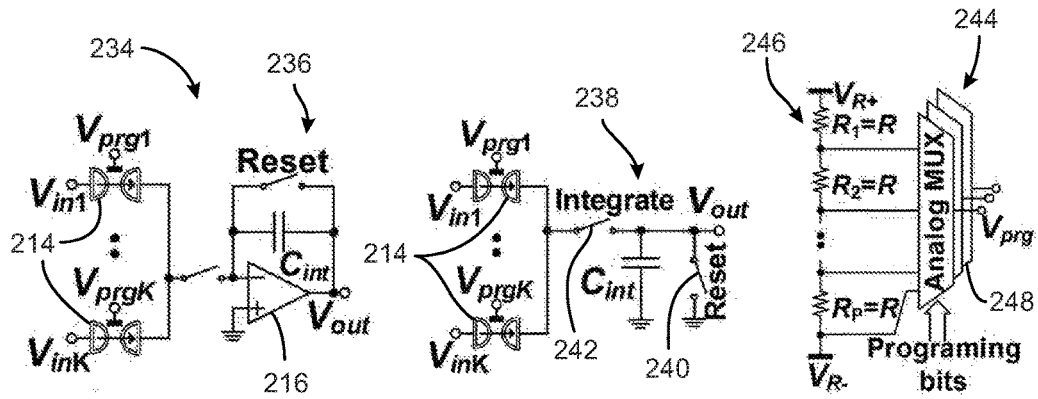
FIGS. 13(c)-(e) illustrates example associative memory circuits that may be used in the system of FIG. 13(a).

The circuit 212 of FIG. 13(a) employs an op-amp-based current-to-voltage conversion. Simpler circuits, such as a common-gate amplifier, may also be utilized for similar pattern recognition if the application does not have stringent accuracy requirements. FIG. 13(c) illustrates another example circuit 234 having an integrator 236 electrically coupled to the output of the associative memory cells 214. This approach is similar to a conventional CNN, and may also be used for pattern recognition, for example. The gain of the integrator 236 can be adjusted by changing the integration time. Another example circuit that may be electrically coupled to the output of the associative memory cells, an integrating circuit 238 that does not require an op-amp, is shown in FIG. 13(d). In the circuit 238 of FIG. 13(d), to find each output, first $C_{int}$ is fully discharged using a reset switch 240. Then an integrating switch 242 is turned on, and the output voltage starts to rise (given an input).

A difference between the integrator 238 of FIG. 13(d) and the circuits 212, 234 of FIGS. 13(a) and 13(c) is that the common output node of the memory cells 214 is not at virtual ground in the integrator of FIG. 13(d). In the circuit 238 of FIG. 13(d), the drain-source voltage of the SymFETs (inside synapses) varies which, in turn, changes the position of the peak current of synapses. Simulation has shown that if $V_{out}$ is below 0.15 V, the error is negligible. For example, with $C_{int}$=0.7 pF and an integration time of 1 ns, the output magnitude corresponding to the target image and the last image (i.e., the closest to the target) in FIG. 13(b) are 137 mV and 117 mV, respectively. Any random input pattern (not matching the target) will generally result in an output voltage about 50 mV, however. Thus, because the output swing is limited and the difference between output voltages get closer to each other, the circuit's processing needs to have a higher precision for the circuit 238 in FIG. 13(d). This is a trade-off for the circuit in FIG. 13(d) lacking an op-amp 216, and therefore consuming less power.

In one example, a digital control unit sets the programming voltages ($V_{prg}$). The process of finding values of $V_{prg}$ using gradient or back-propagation algorithms is well-known in the context of AM memories and neural networks. FIG. 13(e) is a schematic, diagrammatic view of a programming circuit 244 that includes a resistive ladder 246 and an analog multiplexer (MUX) 248. The analog control voltages are produced by digital-to-analog converters (DACs) (not shown). Since several programming voltages are needed, a resistive ladder of DACs can be used and the ladder can be shared by all $V_{prg}$, as shown in FIG. 13(e). $V_{R+}$ and $V_{R-}$ are two reference voltages. If a p-bit analog multiplexer (MUX) consisting of switches and a tap ladder are used, each programming voltage can be varied in the range of $V_{R+}-\Delta_R$ to $V_{R-}$ with a step equal to $$\Delta_R = \frac{V_{R+} - V_{R-}}{P}.$$

A large P allows for fine-tuning the programming voltage.

Figure 14A:
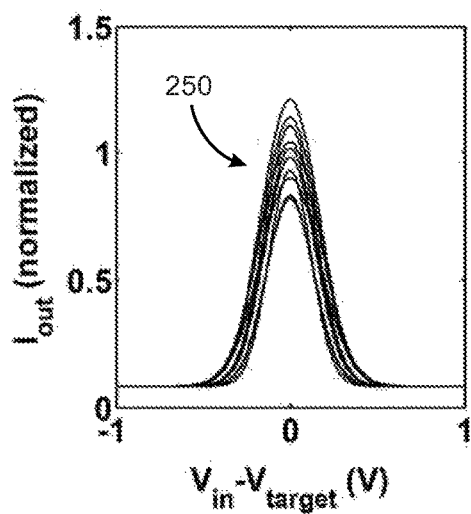
FIG. 14(a) is a plot illustrating the I-V characteristic of an example associative memory cell for a range of voltages and currents.
Figure 14B:
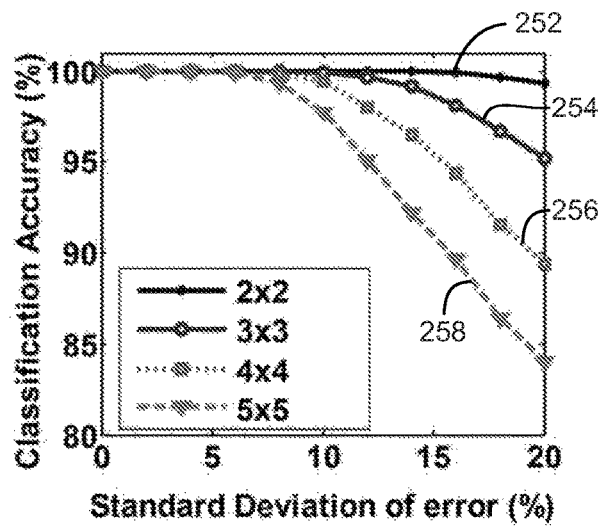
FIG. 14(b) is a plot illustrating the classification accuracy of various sizes of example associative memories.

Fabricated analog circuits generally do not match their models perfectly. For example, for an AM, the shape of the Gaussian function can be affected by process variation. Some variations (e.g., a horizontal shift in the I-V curve) can be diminished by fine tuning the $V_{prg}$. Nevertheless, when parameters $I_1$ and $V_1$ have error, both the peak current and the width of the bell-curve will be affected. FIG. 14(a) is a plot illustrating various I-V curves 250 for various values of $I_1$ and $V_1$. FIG. 14(b) is a plot including four plot lines 252, 254, 256, 258 that illustrate the effects of the standard deviation of error on the accuracy of the pattern recognition circuit according to the arrangement of FIG. 13(a) for a 2×2 array, a 3×3 array, a 4×4 array, and a 5×5 array, respectively. In a "successful" classification with the circuit 212 of FIG. 13(a), the difference between the target and the observed output voltages corresponds to less than one pixel difference. As shown in FIG. 14(b), the larger the pattern (higher K), the tighter the accuracy requirements would be, since one pixel error results in a smaller change in the output voltage in equation (7) and can be masked more easily by the device variations. In practice, the way in which a large pattern is divided into smaller sub-patterns and the limits on device variations may vary from one application to another.

Associative Memory Using Nonlinear $I_{DS}$-$V_{GS}$. Another example AM circuit provides an I-V bell curve that is determined by a parameter called coherence length, which models the portion of graphene that is structurally perfect and depends on the fabrication process employed. Previously in this disclosure, a value of 20 nm was used for a 100 nm×100 nm device. In the following aspect of this disclosure, a coherence length of 75 nm is used.

Figure 15A:
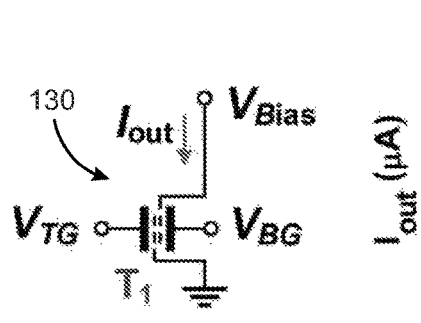
FIG. 15(a) is a schematic view of a SymFET.
Figure 15B:
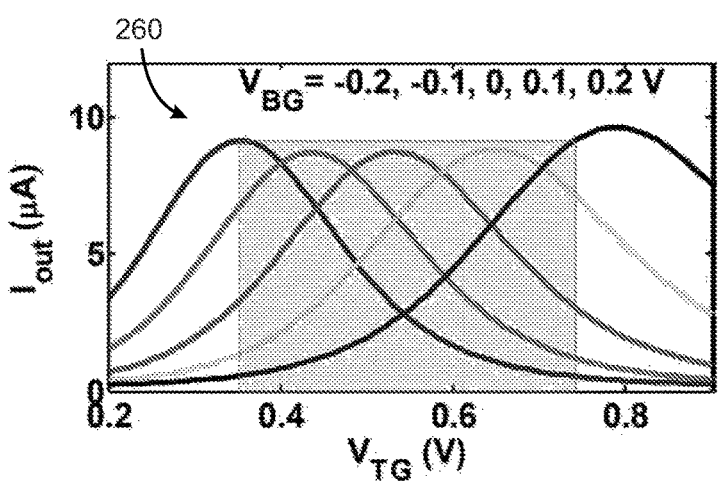
FIG. 15(b) is a plot illustrating the output current and top gate voltage of an example SymFET for various back gate voltages for an example constant drain-source voltage.

FIG. 15(a) is a schematic view of a SymFET 130, and FIG. 15(b) is a plot 260 illustrating the output current of the SymFET for various back-gate (BG) and top-gate (TG) voltages. As shown, it is possible to change the position of the peak drain current by changing the back-gate voltage, since the peak occurs at a certain $V_{TG}$-$V_{BG}$, if $V_{DS}$ is constant. Therefore, in an example AM using a SymFET 130, the top-gate is connected to the input, whereas the back-gate is used for programming.

Figures 16A, 16B:
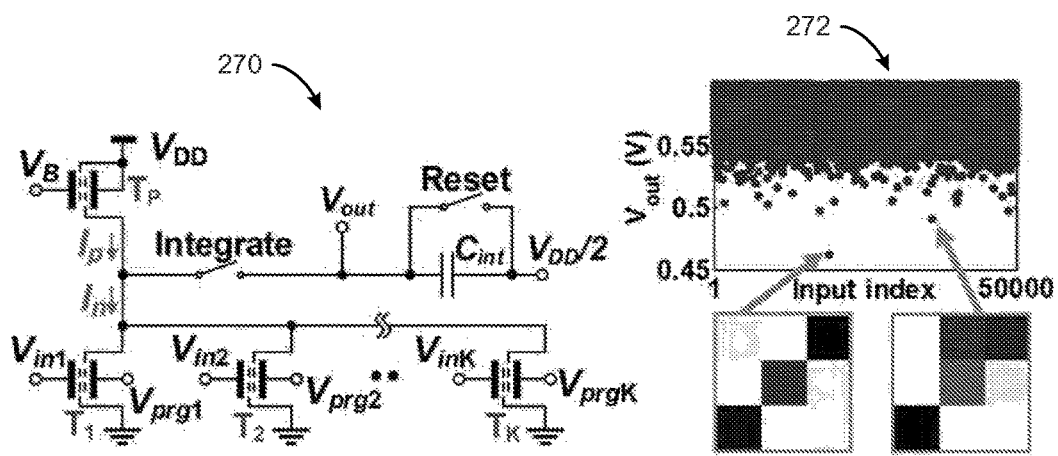
FIG. 16(a) is a schematic view of an example associative memory circuit.
FIG. 16(b) is a diagrammatic view of simulation results for a variety of input images in the associative memory circuit of FIG. 16(a).

FIG. 16(a) is a schematic view of a SymFET-based AM circuit 170 arranged according to an integrating structure. In the circuit 170, SymFET $T_P$ acts almost as a current source and can be tuned via $V_B$. It has the same role as the threshold input in ANNs or CNNs. Each process starts by resetting $C_{int}$. This also sets the drain-source voltage of the SymFETs at the desired value. If the input array matches the target, $I_n$ will be at a maximum. For a properly set $V_B$, $I_n$ will be larger than $I_p$, and $V_{out}$ will go down. In contrast, for nonmatching patterns, $I_n$ is most likely lower than $I_p$, and $V_{out}$ increases. The integration time should be large enough to allow for charging/discharging of $C_{int}$, and not too large such that the variation of $V_{out}$ remains around 0.1 V, for which $I_{DS}$ of SymFETs is approximately constant around the peak.

Simulation results 172 are shown FIG. 16(b) for a nine-input (i.e., 3×3) circuit. The size of $T_P$ is set to be eight times that of $T_{1-9}$ to ensure that, for a matching input, $I_n$ is larger than $I_p$. Programming voltages correspond to the target pattern in FIG. 13(b), and random inputs with uniform distribution were applied to the circuit in SPICE. For each input pattern, the integration time is 1 ns. As seen in FIG. 16(b), an input pattern that is more similar to the target generates a smaller $V_{out}$.

Device Comparison. In conventional CNNs, the synaptic interfaces are realized with differential pairs or operational transconductance amplifiers (OTAs). The nonlinearity of the cell is defined by that of a differential pair, which is a sigmoid function. In the context of AMs, a sigmoid function is well suited for binary classification, e.g., for processing black-and-white images. A Gaussian function is more suitable for analog (gray-scale) inputs, since it only produces a large output when the input falls into the peaking region of the function. By analogy with frequency-selective filters: a low-pass (or high-pass) filter selects frequencies lower (or higher) than a cutoff frequency, whereas a band-pass filter only passes the frequencies that are in a predefined range. Similarly, SymFET-based Gaussian functions can be viewed as a band-pass filter in the amplitude domain, as compared to known CNNs, which are analogous high-pass or low-pass filters.

Previous CMOS-based implementation of analog Euclidean distance calculation, consisting of subtracting blocks for finding the difference between the input sample and the target, and squaring blocks, are active circuits mostly based on current-mode signal processing. As a comparison, an active synapse was simulated in a 0.13 μm CMOS process. For comparison, a peak-to-valley ratio similar to that of FIG. 11(d) was targeted so that the common node of the synapses, which has the largest parasitic capacitance, is charged and discharged with the same current, and hence the speed of the circuits would be similar. In the simulation, the internal delay of the CMOS-based circuit was set to be relatively small. The CMOS-based synapse had 23 transistors and consumed an average power of 76 W (excluding the input voltage-to-current converter). In the SymFET-based design of FIG. 13(a), the current passing through the device results in some power dissipation, which was found in simulation to be only 7.2 W (excluding the input single-ended-to-differential converter/driver) per synapse on average. For the design in FIG. 16(a), the average power per synapse is 5 W. Thus, the circuit 170 of FIG. 16(a) is more efficient than the circuit 212 of FIG. 13(a), because the circuit of FIG. 16(a) does not require input drivers or op-amps.

Arithmetic Computations on Data Arrays. In addition to diffusion networks and associative memories, TFETs may find use in arithmetic operations such as, for example, estimating the local/global maxima and minima and variance of input data. Finding local extremes is a powerful tool, e.g., for performing adaptive scale selection in image processing, among other uses and purposes. And variance indicates the energy of the input signal. In image processing, an analog variance calculation enables efficient segmentation of patterns at different scales and resolutions. For example, if the variance of a subset of inputs is small, digitizing the inputs in that subset may be unnecessary and, instead, the average of the inputs might be sufficient for representing the data for further computation and processing.

Figures 17A, 17B, 17C, 17D:
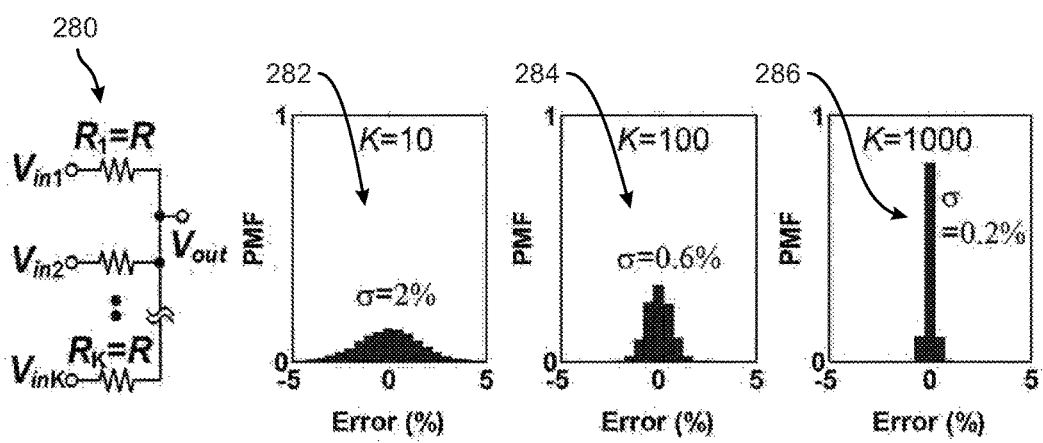
FIG. 17(a) is a schematic view of an example resistive averaging network circuit.
FIGS. 17(b)-(d) are plots illustrating probability mass functions of the output error of the circuit of FIG. 17(a) for three respective different circuit sizes.

Before proceeding to a disclosure of the novel arithmetic computation circuits using tunneling devices, a relevant point about precision will be set forth, using the well-known averaging circuit 280 shown in FIG. 17(a). While such analog circuits do not have a high computational precision, as the number of the inputs increases, the precision of the output voltage improves. This is demonstrated in FIGS. 17(b), 17(c), and 17(d), which are bar graphs 282, 284, 286 of the error distribution for 10, 100, and 1000 inputs for versions of the circuit of FIG. 17(a), respectively. As seen in the example charts of FIGS. 17(b)-(d), the random mismatch of resistors will be averaged out when the number of inputs is large, resulting in a narrower error distribution. It should be noted that it is possible to implement the averaging network of FIG. 17(a) using TFETs such as, for example, using an NNTFET arrangement (see FIG. 5(c)) to obtain linear resistors.

Figures 18A, 18B, 18C:
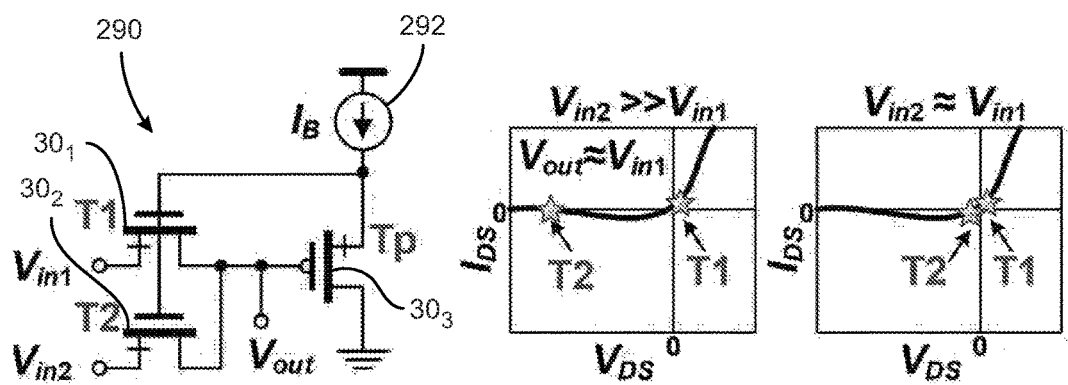
FIG. 18(a) is a schematic view of an example circuit for finding a minimum value of a set of inputs.
FIGS. 18(b) and 18(c) are plots illustrating the I-V characteristic of transistors T1 and T2 in the circuit of FIG. 18(a) for different input types.

Arithmetic Computation—Minimum/Maximum. The asymmetry of TFETs can be utilized, for example, to find a local or global minimum and/or maximum. FIG. 18(a) is a schematic view of a circuit 290 for finding the minimum of two input signals $V_{in1}$ and $V_{in2}$, the circuit having three NTFETs $30_1$, $30_2$, $30_3$ (also referred to as T1, T2, and TP, respectively). A current source 292 is coupled to a gate of first and second NTFETs T1 and T2, and to the source of a third NTFET TP. The sources of the first and second NTFETs $30_1$, $30_2$ are coupled to first and second inputs $V_{in1}$ and $V_{in2}$, respectively. The output of the circuit is taken from a node electrically coupled to the gate of the third NTFET $30_3$ and the drains of the first and second TFETs $30_1$, $30_2$. The drain of the third NTFET $30_3$ is electrically coupled to ground.

For ease of description, this disclosure assumes that $V_{in1}$ is smaller than $V_{in2}$, though a person of skill in the art will appreciate that the circuit may be utilized and/or modified to address the opposite situation. Clearly, the output voltage $V_{out}$ is $V_{in1}<V_{out}<V_{in2}$; T1 has a positive $V_{DS}$, and T2 has a negative $V_{DS}$. Two possible quiescent points are shown in FIG. 18(b), for which $I_{DS1}=-I_{DS2}$. If $V_{in1}<<V_{in2}$, then T2 has a large negative $V_{DS}$, works in the NDR region, and has a large resistance, whereas T1 is biased near $V_{DS}=0$, and has a much smaller on-resistance. As a result, the voltage divider formed by the resistances of T1 and T2 produces an output voltage close to the smaller input. Alternatively, if $V_{in1}$ and $V_{in2}$ are close to each other, T1 and T2 are both operating in the superlinear region, and $V_{out}$ will be close to the average of the two inputs. Although there is an error in this case, it will be small, since the inputs are close to each other.

The gate signal of T1 and T2 in the example circuit of FIG. 18(a) is generated by a source-follower buffer $I_B$. If the gate voltages of T1 and T2 are instead connected to a fixed voltage, the gate-source voltage of T1 and T2 would vary with input voltage, a transistor biased in the NDR region (T2 in the previous example) could end up with a relatively large $V_{GS}$ and $|I_{DS}|$. To prevent this, the gate voltages of the transistors are connected to a voltage equal to $V_{out}+|V_{GSp}|$, where $T_P$ is biased such that $V_{GSp}(<0)$ is close to the threshold voltage of a PTFET. Thus, the transistor that is connected to the smallest input and has $V_D \approx V_S \approx V_{out}$ is on, and has a small on-resistance, whereas other transistors have smaller $V_{GS}$ and conduct a small current. The smaller their current, the lower the voltage drop across the on-resistance, and the more accurate $V_{out}$ will be.

Figures 18D, 18E:
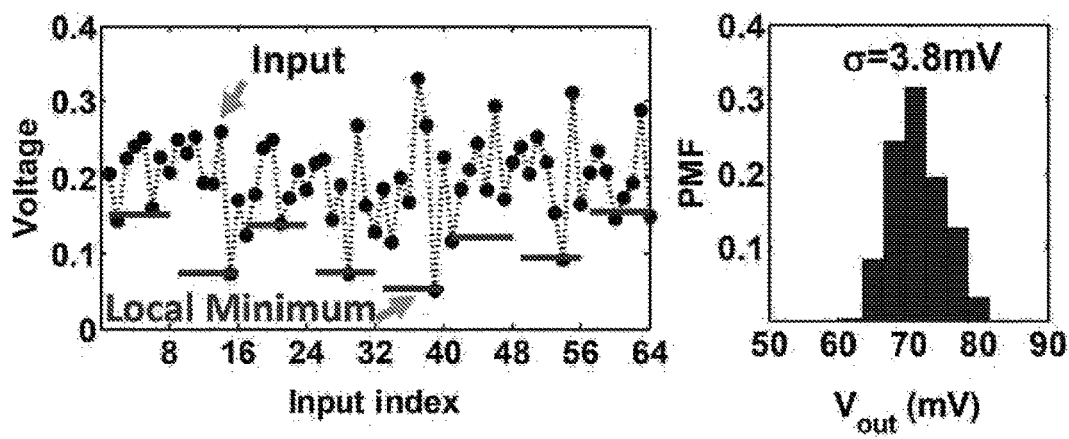
FIG. 18(d) is a plot illustrating example inputs and local minima of those inputs determined with an example set of minimum-determination circuits.
FIG. 18(e) is a plot illustrating variations of the global minima in the example circuit employed for the data of FIG. 18(d) with transistor variations.

The example circuit 290 in FIG. 18(a) can be extended for additional inputs by adding more transistors in parallel with T1 and T2. FIGS. 18(d) and (e) show the SPICE simulation results in a case study, wherein the global minimum and 8 local minima are found using one 64-input and eight eight-input minimum circuits, respectively. As seen in FIG. 18(d), the calculated minimum is more accurate when the smallest input is largely different from other inputs. FIG. 18(e) shows the variations of the global minimum with transistor variations. In this circuit, each input transistor has a W of 0.8 μm, and $T_P$ has a W=3.2 μm. $V_{out}$ has a mean of 68 mV, whereas the actual minimum value among the inputs in 50 mV. The time needed to find the global minimum is 4.7 ns. The power consumption of the example circuit has two parts; which is 0.8 A, and the power that is sourced by the inputs. For the input pattern in FIG. 18(d), the input voltages deliver a total current of 0.12 μA (the smallest input voltage sinks this current). The total power consumption of the example circuit is about 0.5 W at a supply voltage of 0.6 V. It should be added that, by swapping N-type for P-type transistors in FIG. 18(a), the circuit will find the approximate maximum instead of minimum.

Figure 19A:
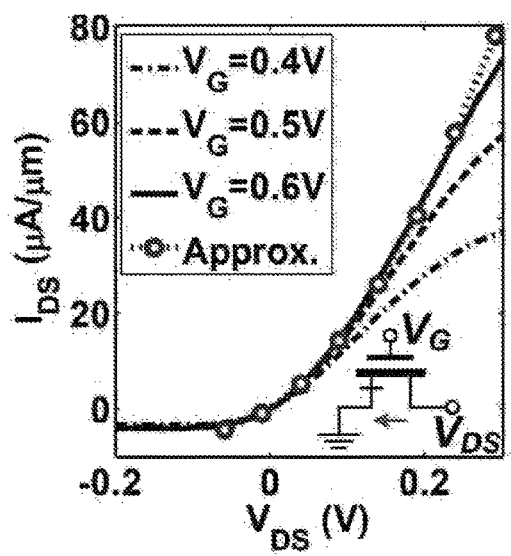
FIG. 19(a) is a plot illustrating the I-V characteristic of an example NTFET operating in the superlinear region for a range of gate voltages, as well as a quadratic approximation of that I-V characteristic for a particular gate voltage.

Variance. A quadratic function is generally used to find variance. Accordingly, the quadratic $I_{DS}$ vs. $V_{GS}$ characteristic of FETs may be theoretically utilized towards this end. However, the threshold voltage of FETs makes it difficult to use that characteristic effectively for small input amplitudes. Another example approach is to utilize the superlinear characteristic of TFETs. FIG. 19(a) includes a schematic of a TFET and a plot illustrating respective I-V curves in the superlinear region of the TFET for three gate voltages and a quadratic approximation for the third gate voltage, respectively. As shown in FIG. 19(a), for a high $V_{GS}$, the superlinear region is relatively large.

Figure 19B:
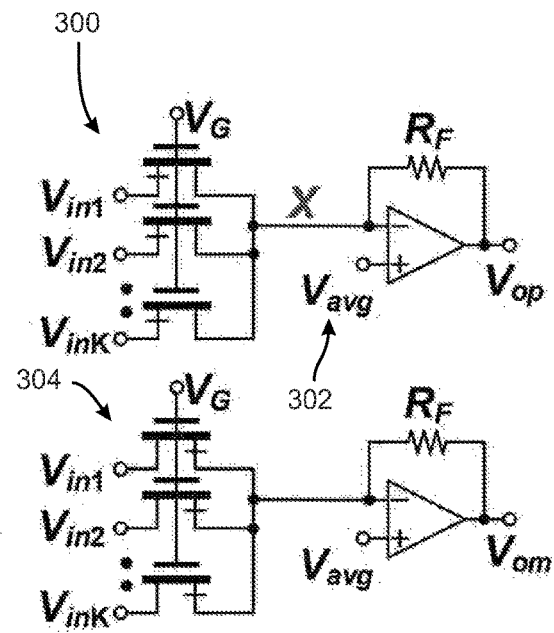
FIG. 19(b) is a schematic view of a variance-finding circuit.

For a given $V_{GS}$, the drain current in the superlinear region of the TFET can be approximated by equation (8) below (which is consistent with the plot lines of FIG. 19(a)):

$$I_{DS} = f(V_{DS}) \approx \begin{cases} aV_{DS}(V_{DS} - 2V_0) & \text{if } V_{DS} > V_0 \\ -aV_0^2 & \text{if } V_{DS} \leq V_0 \end{cases} \quad (8)$$

where a and $V_0$ (<0) are constants (for given device size and $V_G$). Since this approximate quadratic function does not cover $V_{DS} \leq V_0$, two parallel circuits are used, in an example. FIG. 19(b) illustrates this example circuit 300. In the circuit 300 of FIG. 19(b), one circuit portion 302 (top half of FIG. 19(b)) receives input voltages higher than the average ($V_{avg}$), and the other circuit portion 304 (bottom half of FIG. 19(b)) receives input voltages lower than the average. The inverting input of the op-amps (node X) is biased at $V_{avg}$, because of the large open-loop gain of op-amps. The output voltages of the circuit 300 of FIG. 19(b), $V_{op}$ and $V_{om}$, are given as equations (9) and (10) below:

$$V_{op} = V_{avg} + R_F \Sigma_{j=1}^{K} f(V_{avg} - V_{in,j}) \quad (9)$$

$$V_{om} = V_{avg} - R_F \Sigma_{j=1}^{K} f(V_{in,j} - V_{avg}) \quad (10)$$

Using equation (8) in conjunction with equations (9) and (10), the final output is given by equation (11) below:

$$V_{op} - V_{om} \approx aR_F \Sigma_{j=1}^{K}(V_{in,j} - V_{avg})^2 + aR_F \Sigma_{j \in P2}[2(V_{avg} - V_{in,j})V_0 - V_0^2] + aR_F \Sigma_{j \in P1}[2(V_{in,j} - V_{avg})V_0 - V_0^2] \quad (11)$$

where P1 and P2 are sets of j for which $V_{in,j} < V_{avg} + V_0$, and $V_{in,j} > V_{avg} - V_0$, respectively. If all inputs are close to $V_{avg}$ (i.e., $V_{avg} + V_0 < V_{in,j} < V_{avg} - V_0$), the variance is accurate, and the output voltage is proportional to variance. In other cases (e.g., where inputs are significantly larger or smaller than $V_{avg}$), the second and third summations in the right-hand-side of equation (11) introduce some error.

Figure 19C:
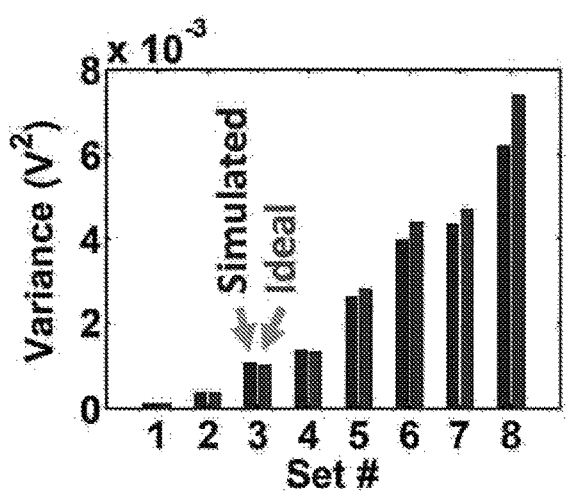
FIG. 19(c) is a plot illustrating the actual ("ideal") variance and determined ("simulated") variance for a given input set based on a simulation using the circuit of FIG. 19(b).
Figure 19D:
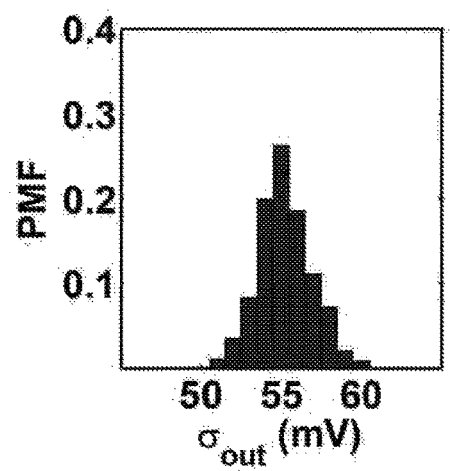
FIG. 19(d) is a plot illustrating the impact of transistor mismatches on the resulting standard deviation in the circuit of FIG. 19(b).

To evaluate the accuracy of the circuit, a few sets of input voltages, each with K=64 elements, normal distribution, and a standard deviation in the 10-80 mV range, were simulated. In the test, $V_G$ was 0.8 V and $V_{avg}$ was about 0.2 V (resulting in $V_0 \approx -0.1$ V). The results are given in FIG. 19(c), and demonstrate a good accuracy for small variances. For large variances, the quadratic approximation in FIG. 19(a) and also the extra terms in equation (11) lead to underestimating the variance. FIG. 19(d) shows the impact of transistor mismatches on the resulting standard deviation (square root of variance); here, each transistor has an effective width of 0.1 μm, $R_F$ (=4.2 kΩ), and op-maps have no errors. The actual standard deviation in this data set is 57 mV. The simulated standard deviation has an average of 55 mV.

Speed and power of the example circuit are mainly determined by the op-amp. Using a two-stage Miller-compensated topology for the op-amp, and assuming a parasitic load capacitance of 50 femtofarads (fF), the power consumption of the circuit was found to be 0.26 mW. The output settles to within 1% of the final value in less than 4 ns. Considering that 64 multiplications and 63 additions are required to calculate the variance, performing the same task in the digital domain would need a DSP with a power efficiency of 100 TOPS/W. Accordingly, the variance circuit presents an advantageous power-efficient means of calculating variance in the analog domain.

Conclusion. As described above, the unique characteristics of tunneling devices (e.g., TFETs and SymFETs) can be an asset in non-Boolean information-processing hardware. TFET and SymFET technologies may be utilized to enhance the performance of diffusion networks and associative memories, especially in terms of power dissipation.

Although certain example methods and apparatus have been described herein, the scope of coverage of this patent is not limited thereto. On the contrary, this patent covers all methods, apparatus, and articles of manufacture fairly falling within the scope of the appended claims either literally or under the doctrine of equivalents.

We claim:

1. An electrical circuit comprising:
a plurality of tunneling field-effect transistors (TFETs) arranged in a diffusion network matrix having a plurality of nodes wherein, for each of the TFETs that is not on an end of the matrix, a drain of the TFET is electrically coupled with the source of at least one of the other TFETs at a node of the matrix and a source of the TFET is electrically coupled with the drain of at least one of the other TFETs at another node of the matrix; and
a plurality of capacitors, wherein a respective one of the plurality of capacitors is electrically coupled with each node that includes the source of at least one TFET and the drain of at least one TFET.

2. The electrical circuit of claim 1, wherein the TFETs comprise symmetrical graphene-insulator-graphene field-effect transistors (SymFETs).

3. The electrical circuit of claim 2, wherein, for each of said plurality of SymFETs, a first gate of the SymFET is electrically coupled to a source of the SymFET and a second gate of the SymFET is electrically coupled to a drain of the SymFET.

4. The electrical circuit of claim 2, wherein, for each of said plurality of SymFETs, a first gate of the SymFET is electrically coupled to a source or a drain of the SymFET and a second gate of the SymFET is electrically coupled to a control voltage.

5. The electrical circuit of claim 4, further comprising a DC control voltage source, electrically coupled to the second gate of each of the plurality of SymFETs.

6. The electrical circuit of claim 4, wherein the SymFETs are arranged in a plurality of anti-parallel pairs.

7. The electrical circuit of claim 2, wherein, for each of said plurality of SymFETs, a first gate and a second gate are electrically coupled to a control voltage.

8. The electrical circuit of claim 1, wherein, for each node of the matrix that includes a drain of a first respective TFET, a source of a second respective TFET, and a capacitor, one or more of the drain of the first respective TFET or the source of a second respective TFET is electrically coupled to the node through a switch.

9. The electrical circuit of claim 8, wherein the switch comprises a MOSFET.

10. The electrical circuit of claim 1, wherein each node of the matrix that includes a drain of a first respective TFET, a source of a second respective TFET, and a capacitor is further electrically coupled to a respective input.

11. The electrical circuit of claim 1, wherein the diffusion network matrix is one-dimensional.

12. The electrical circuit of claim 1, wherein the diffusion network matrix is two-dimensional.

13. The electrical circuit of claim 2, wherein, for each of said plurality of SymFETs, a first gate of the SymFET is electrically coupled to one of a control voltage, or a source or a drain of the SymFET, and a second gate of the SymFET is electrically coupled to one of a control voltage or a source or a drain of the SymFET.

14. A method comprising:
  inputting a plurality of analog inputs into an electrical circuit comprising:
    a plurality of tunneling field-effect transistors (TFETs) arranged in a diffusion network matrix having a plurality of nodes wherein, for each of the TFETs that is not on an end of the matrix, a drain of the TFET is electrically coupled with the source of at least one of the other TFETs at a node of the matrix and a source of the TFET is electrically coupled with the drain of at least one of the other TFETs at another node of the matrix; and
    a plurality of capacitors, wherein a respective one of the plurality of capacitors is electrically coupled with each node that includes the source of at least one TFET and the drain of at least one TFET;
  wherein each node of the matrix that includes a drain of a first respective TFET, a source of a second respective TFET, and a capacitor receives a respective one of the plurality of analog inputs;
  sampling a voltage of each capacitor after a predetermined amount of time; and
  assembling the sampled voltages into an output.

15. The method of claim 14, further comprising controlling a voltage source that is coupled to one or more respective gates of each of the plurality of TFETs to adjust a respective resistance of each of the plurality of TFETs.

16. The method of claim 15, wherein the voltage source is electrically coupled to a first gate of each of the plurality of TFETs, and a second gate of each of the plurality of TFETs is electrically coupled to a source or a drain of the TFET.

17. A system, comprising:
  a sensor comprising a plurality of analog detectors; and
  an electrical circuit comprising a diffusion network, the diffusion network comprising:
    a plurality of tunneling field-effect transistors (TFETs) arranged in a diffusion network matrix having a plurality of nodes wherein, for each of the TFETs that is not on an end of the matrix, a drain of the TFET is electrically coupled with the source of at least one of the other TFETs at a node of the matrix and a source of the TFET is electrically coupled with the drain of at least one of the other TFETs at another node of the matrix; and
    a plurality of capacitors, wherein a respective one of the plurality of capacitors is electrically coupled with each node that includes the source of at least one TFET and the drain of at least one TFET;
  further wherein a respective one of the plurality of analog detectors is electrically coupled with each node that includes the source of at least one TFET, the drain of at least one TFET, and a capacitor.

18. The system of claim 17, wherein the TFETs comprise symmetrical graphene-insulator-graphene field-effect transistors (SymFETs).

19. The system of claim 18, wherein, for each of said plurality of SymFETs, a first gate of the SymFET is electrically coupled to a source of the SymFET and a second gate of the SymFET is electrically coupled to a drain of the SymFET.

20. The system of claim 18, wherein, for each of said plurality of SymFETs, a first gate of the SymFET is electrically coupled to a source or a drain of the SymFET and a second gate of the SymFET is electrically coupled to a control voltage.

* * * * *